(12) United States Patent
Eto et al.

(10) Patent No.: US 6,201,378 B1
(45) Date of Patent: *Mar. 13, 2001

(54) SEMICONDUCTOR INTEGRATED CIRCUIT

(75) Inventors: Satoshi Eto; Masato Matsumiya; Masato Takita; Toshikazu Nakamura; Ayako Kitamoto; Kuninori Kawabata; Hideki Kanou; Masatomo Hasegawa; Toru Koga; Yuki Ishii, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,203

(22) Filed: Apr. 28, 1999

(30) Foreign Application Priority Data

May 7, 1998 (JP) .................................................. 10-124863
Mar. 31, 1999 (JP) .................................................. 11-092781

(51) Int. Cl.[7] .................................................. G05F 3/16
(52) U.S. Cl. .................................................. 323/313
(58) Field of Search .................................. 323/313–316; 330/257, 288; 327/535, 538, 539

(56) References Cited

U.S. PATENT DOCUMENTS 5,019,729 * 5/1991 Kimura ................................. 307/475
5,317,254 * 5/1994 Olson ................................... 323/316
5,519,309 * 5/1996 Smith ................................... 323/316
5,554,953 * 9/1996 Shibayama et al. .................. 327/541

FOREIGN PATENT DOCUMENTS 286404 9/1996 (TW) .

OTHER PUBLICATIONS

Copy of Taiwanese Office Action for corresponding Taiwanese Patent Application No. 88106841 dated Aug. 18, 2000.

* cited by examiner

Primary Examiner—Matthew Nguyen
(74) Attorney, Agent, or Firm—Armstrong, Westerman, Hattori, McLeland & Naughton

(57) ABSTRACT

A semiconductor integrated circuit producing a given output voltage includes first and second operational amplifiers, and first and second transistors. The first and second operational amplifiers detect a voltage difference between a voltage applied to an input terminal and at least one reference voltage. The first and second transistors are turned ON or turned OFF according to the levels of voltages output from the first and second operational amplifiers. The first operational amplifier receives the output voltage at the input terminal. When the level of the output voltage becomes lower than the reference voltage, the first operational amplifier allows the first transistor to operate so as to raise the output voltage. In contrast, the second operational amplifier receives the output voltage at the input terminal. When the level of the output voltage exceeds the reference voltage, the second operational amplifier allows the second transistor to operate so as to lower the output voltage.

24 Claims, 11 Drawing Sheets

SEMICONDUCTOR INTEGRATED CIRCUIT

BACKGROUND OF THE INVENTION

Field of the Invention

The present invention relates to a semiconductor integrated circuit, including a dynamic random access memory (generally abbreviated "DRAM") and having an ability to stably produce an intended output voltage.

Normally, in a semiconductor integrated circuit including a DRAM, a plurality of word lines and a plurality of pairs of bit lines crossing the word lines are arranged in the form of a matrix. A plurality of memory cells are formed at intersections between the word lines and bit lines. The memory cells constitute a memory cell array.

Assume that data of "1" or "0" is read from a memory cell selected from among the plurality of memory cells. The potential at a pair of bit lines to which the memory cell is connected is varied according to electric charges accumulated in a cell capacitor in the memory cell. The variation in the potential at the bit lines is detected by a sense amplifier. The variation in the potential at the bit lines must be detected reliably by using a current that is as small as possible (i.e., with minimum power consumption). A method normally adopted for this purpose will be described below. That is to say, before the electric charges which have been accumulated in the cell capacitor in the memory cell are redistributed on the pair of bit lines according to the capacitance offered by the bit lines, the bit lines are short-circuited. The bit lines are then precharged so that the potential at the bit lines will be equal to a certain supply voltage (for example, a half of a high-level supply voltage Vcc (=Vcc/2)).

On the other hand, a high-level supply voltage Vcc or a low-level supply voltage Vss (=0 V) is applied to a cell storage node of the capacitor in the memory cell. At this time, either the high-level supply voltage or the low-level supply voltage is applied depending on whether or not the memory cell has been selected. In a typical DRAM, the capacitance of a cell capacitor is required to be as large as possible in order to make the data holding time relatively long. For this purpose, it is necessary to reduce the thickness of an insulating film of the cell capacitor as much as possible. As the thickness of the insulating film decreases, the durability of the insulation of the cell capacitor, when a high voltage is applied to the cell capacitor, deteriorates. The potential at an electrode (cell plate node) opposed to the cell storage node of the cell capacitor is therefore set to Vcc/2. Thus, even when the supply voltage Vcc or Vss is applied to the cell storage node of the cell capacitor, a potential difference between both surfaces of the insulating film of the cell capacitor is merely Vcc/2. More specifically, in the case in which the potential at the electrode opposed to the cell storage node of the cell capacitor is set to Vcc/2, a voltage applied to the insulating film is only a half of a voltage applied thereto when the potential at the electrode opposed to the cell storage node of the cell capacitor is set to Vcc or Vss. Consequently, the capacitance of the cell capacitor can be made relatively large by reducing the thickness of the insulating film. This is advantageous in elongating the data holding time.

In recent years, especially, a DRAM has been required to operate with a supply voltage that is as low as possible, for example, a supply voltage (Vcc) which is equal to or less than 2 V. This is intended to minimize power consumption of the whole semiconductor integrated circuit. As mentioned above, in a typical DRAM, a voltage used to precharge the bit lines or the potential at an electrode opposed to a cell storage node of a cell capacitor is usually set to Vcc/2. Therefore, it is necessary to stably generate a relatively low voltage which is equal to or less than 1 V.

Now, referring to FIGS. 1 to 5 that will be mentioned later in "BRIEF DESCRIPTION OF THE DRAWINGS," an exemplary configuration of a bit line precharging circuit in a typical DRAM, and an exemplary structure of a memory cell, will be described below. A variation in the potential at bit lines occurring when the bit lines are precharged, and an exemplary configuration of a semiconductor integrated circuit having a conventional constant voltage generating circuit will also be described. The above description is intended to reveal the reasons why it is necessary to generate a voltage that is a half of a supply voltage Vcc (that is, Vcc/2) in the DRAM. Also, the above description is intended to clarify problems underlying the generation of the voltage Vcc/2 that is equal to or less than 1 V.

In FIG. 1, an outline configuration of a typical DRAM is shown.

As shown in FIG. 1, the typical DRAM has a memory cell array 100 in which a plurality of word lines and a plurality of pairs of bit lines are arranged in the form of a matrix. Moreover, a plurality of memory cells is formed at intersections between the word lines and bit lines. Furthermore, the DRAM includes a decoder 600 for decoding control address bits A0 to Am (where m is any positive integer equal to or larger than 1) that are inputted via an input buffer 500. The decoder 600 then produces a memory cell selection signal which is used to select a specific memory cell. The decoder 600 applies a certain boosted voltage Vpp (a voltage higher than a supply voltage Vcc that is an internal voltage) to a word line to which the specific memory cell is connected, and thus selects the word line. Output data is sensed or data is rewritten, whereby data is read from the specific memory cell or written into the specific memory cell.

Furthermore, the DRAM includes a sense amplifier 200. For reading a specific memory cell selected by the decoder 600, the sense amplifier 200 detects electric charges transferred from the cell capacitor Cc (See FIG. 3 that will be described later) in the specific memory cell. The sense amplifier 200 thus reads data from the memory cell. The data which has been read by the sense amplifier 200 is amplified up to a given level by a main amplifier 300. The resultant data is then outputted as digital I/O data of bits DQ0 to DQn (n=0, 1, 2, —) to the outside of the DRAM.

In the above-mentioned DRAM, it is the bit line precharging circuit and cell capacitor that require the voltage Vcc/2 that is half of the supply voltage Vcc (output voltage Vpr in FIGS. 2 and 3). Herein, the bit line precharging circuit is included in the sense amplifier 200 shown in FIG. 2. The cell capacitor is included in any memory cell 100 shown in FIG. 3. In FIG. 1, the sense amplifier 200 and memory cell 100 are hatched in an effort to explicitly show the components that use the voltage equivalent to half of the supply voltage Vcc.

To be more specific, the bit line precharging circuit in the sense amplifier 200 shown in FIG. 1 includes bit line precharging transistors 210, 220 and 230 which precharge a pair of bit lines BL and /BL to select the specific memory cell. One of the memory cell selection transistors (230) is realized by an NMOS transistor (n-channel MOS transistor) and has a source and a drain (or a drain and a source) thereof connected to the pair of bit lines BL and /BL, respectively, so as to equalize potentials at both of the pair of bit lines BL and /BL memory cell, and inputs a precharge enabling signal φ through a gate thereof. The other two bit line precharging transistors (210 and 220) are realized by two NMOS transistors for precharging the pair of bit lines BL and /BL. In this configuration, a drain (or source) of the bit line precharging transistor 210 is connected on one bit line BL. A drain (or source) of the other bit line precharging transistor 220 is connected to the other bit line /BL. Further, the sources (or drains) of the bit line precharging transistors 210 and 220 are connected to a common node. A precharging output voltage Vpr (for example, a half of a supply voltage Vcc (Vcc/2)) is applied to the common node. The precharge enabling signal φ is applied to each of the gates of the three bit line precharging transistors 210, 220 and 230.

Furthermore, any memory cell of a one-transistor and one-capacitor type, as shown in FIG. 3, is composed of one cell transistor Tc which is realized by an NMOS transistor and one cell capacitor Cc. For writing data "1" or "0" in this type of memory cell over the bit lines BL and /BL, a boosted voltage is applied to a gate of the cell transistor Tc over a word line WL. The cell transistor Tc is thus driven so as to enter an operating state (ON state). In this case, electric charges are accumulated in the cell capacitor Cc according to the data "1" or "0." Moreover, assuming that the memory cell is selected to read data from the memory cell, electric charges which have been accumulated in the cell capacitor Cc is redistributed on the pair of bit lines to which the memory cell is connected, according to a capacitance offered by the bit lines. The potential at the pair of bit lines is thus varied. The variation in potential at the bit lines is detected by the sense amplifier.

In FIG. 4, a timing chart indicating the variation in the potential at the bit lines occurring when the bit lines are precharged with half of the voltage Vcc, is shown. In FIG. 5, a timing chart indicating the variation in potential at the bit lines occurring when the bit lines are precharged with the supply voltage Vss (=0 V), is shown.

Based on the timing charts of FIGS. 4 and 5, the relationship between a voltage required to precharge bit lines and power consumption required to read data will be discussed below. Herein, assume that data "1" or "0" is read from a specific memory cell selected from among a plurality of memory cells. The variation in the potential at the pair of bit lines occurring when the bit lines are precharged with a voltage Vcc/2 is compared with the variation in the potential occurring when the bit lines are precharged with a voltage Vss (=0 V).

As shown in FIG. 4, before data is read from the specific memory cell which has become an active state, the pair of bit lines are precharged with the voltage Vcc/2. Assuming that the capacitance offered by the bit lines is Cb1, the amount of electric charges supplied from a high-voltage power supply for providing a supply voltage Vcc becomes (Vcc/2)·Cb1 at the timing ①. The amount of electric charge becomes zero (0) at the time timing ②. This is because when the pair of bit lines BL and /BL offering the same capacitance is short-circuited and precharged, the potential at the bit lines automatically becomes equal to Vcc/2. According to the above technique for precharging the bit lines with the voltage Vcc/2, the amount of electric charges consumed for every cycle is (Vcc/2)·Cb1. The amount of these electric charges is proportional to a current consumed for every cycle, that is, corresponding power consumption.

Assuming, as shown in FIG. 5, that before data is read from the specific memory remaining in the active state, the pair of bit lines is precharged with the voltage Vss (voltage provided by the low-voltage power supply (=0 V)). In this case, the amount of electric charges supplied from the high-voltage power supply that provides the supply voltage Vcc becomes Vcc·Cb1 at the timing ①. The amount of electric charges becomes 0 at the time instant ②. According to the above technique for precharging the bit lines with the voltage Vss, the amount of electric charges consumed for every cycle is Vcc·Cb1. The amount of these electric charges is also proportional to a current consumed for every cycle, that is, corresponding power consumption. The amount of electric charges consumed for every cycle according to the technique for precharging the bit lines with the voltage Vss is twice as large as that consumed according to the technique for pre-charging the bit lines with the voltage Vcc/2. In view of the above, the technique for precharging the bit lines with the voltage Vcc/2 is thought to be effective for reading data with power consumption which is as small as possible.

Further, in the memory cell shown in FIG. 3, the reasons why it is helpful to set the voltage at an electrode (cell plate node Nc) to the voltage Vcc/2 (=Vpr) will be described below. Herein, the above electrode is opposed to a cell storage node of the cell capacitor Cc.

Depending on whether or not the cell transistor Tc in the memory cell is in an operating state (ON state) or a non-operating state (OFF state), a voltage of "H (high)" level (high-level supply voltage Vcc) or a voltage of "L (low)" level (low-level supply voltage Vss) is applied to the cell storage node of the cell capacitor Cc shown in FIG. 3. For example, assume that the supply voltage Vss (=0 V) is applied to the cell plate node Nc of the cell capacitor Cc. When the voltage of "H" level is applied to the cell storage node of the cell capacitor Cc, a voltage difference equivalent to the supply voltage Vcc is applied between both surfaces of the insulating film of the cell capacitor. By contrast, assume that the supply voltage Vcc is applied to the cell plate node Nc of the cell capacitor Cc. When the voltage of "L" level is applied to the cell storage node of the cell capacitor Cc, a voltage difference equivalent to the supply voltage Vcc is also applied between both surfaces of the insulating film of the cell capacitor.

In contrast, assuming that the voltage Vcc/2 is applied to the cell plate node Nc of the cell capacitor Cc when either of the voltage of "H" level and the voltage of "L" level is applied to the cell storage node of the cell capacitor Cc, only a voltage difference equivalent to the voltage Vcc/2 is applied between both surfaces of the insulating film of the cell capacitor.

In the case of a typical DRAM, the capacitance of a cell capacitor is required to be as large as possible for attaining a high density of memory cells constituting a memory cell array. For this purpose, it is necessary to make the thickness of the insulating film of the cell capacitor as thin as possible. The thinner the insulating film is, the lower is a durability concerning an insulation of the cell capacitor when a high voltage is applied to the cell capacitor. By the way, assume that the voltage Vcc/2 is always applied to the cell plate node Nc of the cell capacitor. In this case, when either of a voltage of "H" level and a voltage of "L" level is applied to the cell storage node of the cell capacitor, only a voltage difference Vcc/2 is applied between both surfaces of the insulating film of the cell capacitor. In other words, assume that the voltage Vpr at the cell plate node Nc of the cell capacitor is set to Vcc/2. The voltage difference applied to the insulating film of the cell capacitor at this time is a half of the voltage difference applied when the voltage at the cell plate node Nc is set to the supply voltage Vcc or Vss. In this case, the voltage which is to be applied to an electrode opposed to the cell storage node of the cell capacitor Cc is a voltage Vcc/2.

Consequently, the capacitance of the cell capacitor can be made relatively large by reducing the thickness of the insulating film.

In FIG. 6, a circuit diagram showing an exemplary configuration of a semiconductor integrated circuit including a conventional constant voltage generating circuit which has been devised in an effort to produce the voltage Vcc/2 stably, is illustrated.

In FIG. 6, two voltage divider resistors R6 and R7 are connected in series with each other between an internal supply voltage Vint (for example, a high-level supply voltage Vcc) and a ground (low-voltage supply voltage of 0 V). The two voltage divider resistors R6 and R7 are used to produce a fraction of the internal supply voltage Vint. A constant voltage of an output voltage Vpr is thus developed at an output node that is the junction between the voltage divider resistors R6 and R7. Herein, assume that the internal supply voltage Vint is equal to the supply voltage Vcc and that the voltage divider resistors R6 and R7 have the same resistance. In this case, the output voltage Vpr at the output node is equal to a half of the supply voltage Vcc. The voltage Vcc/2 is therefore developed at the output node. However, a DRAM is required to have reduced power consumption. Power consumption required by the voltage divider resistors R6 and R7 must therefore be as small as possible. Consequently, the resistance of the voltage divider resistors R6 and R7 must be increased to the greatest extent, and the current flowing through the voltage divider resistors R6 and R7 all the time must be suppressed to the greatest extent. However, when the resistance of the voltage divider resistors R6 and R7 is increased too much, the startup characteristics of a supply voltage of the DRAM deteriorates. With regard to the DRAM, it is required to guarantee that the DRAM operates normally after a given time (for example, 200 μsec) has elapsed since the DRAM was powered on (namely, that the DRAM exhibits an excellent startup/response characteristics).

For the constant voltage generating circuit shown in FIG. 6, an effort has been made to improve the startup/response characteristics of the DRAM. Specifically, a first output transistor Q3 realized by an NMOS transistor, and a second output transistor Q4 realized by a PMOS transistor (p-channel MOS transistor) are connected as complementary transistors to the node between the voltage divider resistors R6 and R7. In this case, the first output transistor Q3 and second output transistor Q4 are connected as complementary transistors between the high-voltage power supply and the low-voltage power supply. The sources of the first output transistor Q3 and second output transistor Q4 are connected to a common output node. Thus, a source-follower type power supply circuit is configured.

Furthermore, in the constant voltage generating circuit shown in FIG. 6, the drain of an NMOS transistor Q1 is connected to the gate (node N3) of the first output transistor Q3. The drain of a PMOS transistor Q2 is connected to the gate (node N4) of the second output transistor Q4. Furthermore, the drain of the NMOS transistor Q1 is connected to the high-voltage power supply via a resistor of high-resistance value R4, while the drain of the PMOS transistor Q2 is connected to the low-voltage power supply via a resistor of high-resistance value R5.

Furthermore, in the constant voltage generating circuit shown in FIG. 6, three divider resistors R1, R2, and R3 connected in series with each another are used to produce fractions of the internal supply voltage Vint (for example, the high-level supply voltage Vcc). Thus, two reference voltages of difference levels are produced. More particularly, one reference voltage is developed at a node N1 that is the junction between the divider resistor R1 and divider resistor R2. The reference voltage is applied to the source of the PMOS transistor Q2. On the other hand, the other reference voltage is developed at a node N2 that is the junction between the divider resistor R2 and divider resistor R3. The reference voltage is applied to the source of the NMOS transistor Q1. In this case, the reference voltage developed at the node N1 is set to a level slightly higher than a half of the supply voltage Vcc. The reference voltage developed at the node N2 is set to a level slightly lower than a half of the supply voltage Vcc. These two reference voltages that will be described later in relation to an embodiment shown in FIGS. 10 and 11 are set in order to define a dead zone in which the constant voltage generating circuit is unresponsive to a fluctuation of the voltage Vpr (Vcc/2) developed at the output node. This is intended to prevent the first and second output transistors Q3 and Q4 from becoming operating states simultaneously. When the first and second transistors Q3 and Q4 become operating states simultaneously, a penetrating current flows from the high-voltage power supply to the low-voltage power supply, through the first and second output transistors Q3 and Q4.

Herein, the reference voltage developed at the node N2 is applied to the gate of the first output transistor Q3 through the NMOS transistor Q1. Since the first output transistor Q3 operates as a source follower, the output voltage Vpr that is substantially equal to the voltage Vcc/2 is developed at the output node. On the other hand, the reference voltage developed at the node N1 is applied to the gate of the second output transistor Q4 through the PMOS transistor Q2. Since the first output transistor Q4 operates as a source follower, a voltage that is substantially equal to the voltage Vcc/2 is developed at the output node.

Furthermore, in the constant voltage generating circuit shown in FIG. 6, when the level of the output voltage Vpr at the output node falls below a predetermined value, a voltage between the gate and source of the third output transistor Q3 that is an NMOS transistor becomes an operating state. Consequently, the third output transistor Q3 is turned ON. The high-voltage power supply and output node are then linked by the third output transistor Q3. The voltage at the output node is controlled to rise accordingly, so that the output voltage Vpr at the output node will become substantially equal to Vcc/2. On the other hand, when the level of the output voltage Vpr at the output node becomes higher than Vcc/2 by the predetermined value, a voltage between the gate and source of the fourth output transistor Q4 that is a PMOS transistor rises. The fourth output transistor Q4 is then turned ON. Consequently, the low-voltage power supply and output node are linked by the fourth output transistor Q4. This causes the voltage at the output node to fall. The output voltage Vpr at the output node becomes nearly equal to Vcc/2.

As mentioned above, in the conventional semiconductor integrated circuit including a DRAM, a source follower type power supply circuit is used to produce a voltage corresponding to a half of a supply voltage Vcc. The source follower type power supply circuit as shown in FIG. 6 (first and second output transistors Q3 and Q4) includes MOS transistors that operate as a source follower. However, recently, there has been a tendency toward the request that the DRAM is allowed to operate with a supply voltage which is as low as possible, for example, a supply voltage equal to or less than 2 V. The threshold voltage Vth between a gate and a source of a MOS transistor employed in a source follower type power supply circuit, i.e., the threshold voltage required at the minimum for allowing a current to flow through the source and drain of the MOS transistor is usually about 0.5 V. Reference voltages which are to be input to the first and second output transistors Q3 and Q4 that operate as a source follower are supplied via the NMOS transistor Q1 and PMOS transistor Q2.

Here, assume that a voltage applied between a gate and a source of the first output transistor Q3 is VGS (Q3) and a voltage applied between a gate and a source of the second output transistor is VGS (Q4). Further, assume that a reference voltage at a node N1 is V (N1) and a reference voltage at a node N2 is V (N2). Furthermore, assume that the threshold voltage between a gate and a source of the NMOS transistor Q1 is Vth (Q1) and the threshold voltage between a gate and a source of the PMOS transistor Q2 is Vth (Q2).

In this case, a voltage VGS (Q3) applied between a gate and a source of the first output transistor Q3 corresponds to a voltage which is produced by subtracting the output voltage Vpr ($\approx$Vint/2) at the output node, from a value obtained by adding up the reference voltage at the node N2 which is about Vint and the threshold voltage Vth (Q1) between a gate and a source of the NMOS transistor Q1. On the other hand, a voltage VGS (Q4) applied between a gate and a source of the second output transistor Q4 corresponds to a voltage which is produced by subtracting a value obtained by subtracting the threshold voltage Vth (Q2) between a gate and a source of the PMOS transistor Q2 from the reference voltage at the node N1 which is about Vint/2, from the output voltage Vpr ($\approx$Vint/2) at the output node. The above relationship can be expressed in the following equations (1) and (2).

$$VGS(Q3)=(V(N2)+Vth(Q1))-Vpr(\approx Vint/2) \quad (1)$$

$$VGS(Q4)=Vpr(\approx Vint/2)-(V(N1)-Vth(Q2)) \quad (2)$$

Assuming that an internal supply voltage Vint is a supply voltage Vcc and that this supply voltage Vcc becomes 2 V or less than 2 V, the sum of the threshold voltages Vth (Vth=0.5 V+$\alpha$, where $\alpha$ is an increment by which Vth is increased due to a back bias, and is about 0.2 V) approaches to the level of a half of the supply voltage Vcc (herein, the output voltage Vpr at the output node=Vcc/2$\leq$1.0 V) so that the sum of the threshold voltages is substantially equal to the level of a half of the supply voltage. Therefore, as is obvious from the above equations (1) and (2), the voltage between the gate and source of each of the first output transistor Q3 and the second output transistor Q4 shown in FIG. 6 may therefore not be sufficiently greater than the threshold voltages Vth. The output transistors Q3 and Q4 thus may have difficulty in stably operating as source followers.

The effect brought about the above-mentioned back bias is derived from a variation in threshold voltage Vth of a MOS transistor in accordance with a voltage between the source and the back gate. In particular, the threshold voltage of a MOS transistor operating as a source follower varies depending on an output voltage. The threshold voltage is therefore actually a little higher than 0.5 V as mentioned above.

Consequently, when a supply voltage becomes less than 2 V, the output transistors Q3 and Q4 in the constant voltage generating circuit shown in FIG. 6 cannot fully exert the driving ability necessary for operating as source followers. This causes problems in that the circuit operation for generating a voltage used to precharge bit lines or a voltage which is to be applied to the cell plate node of a cell capacitor in a memory cell cannot be achieved stably.

SUMMARY OF THE INVENTION

The present invention attempts to solve the foregoing problems. An object of the present invention is to provide a semiconductor integrated circuit capable of stably producing a voltage used to precharge bit lines or a voltage which is to be applied to the cell plate node of a cell capacitor in a memory cell, even when the supply voltage is lowered.

For solving the problems, a semiconductor integrated circuit producing a given output voltage in accordance with the present invention comprises a first operational amplifier and a second operational amplifier for detecting a voltage difference between a voltage applied to an input terminal and at least one reference voltage; and a first transistor and a second transistor which are turned ON or turned OFF according to the levels of voltages output from the first and second operational amplifiers.

In such a configuration, the first operational amplifier receives the output voltage at the input terminal, when the level of the output voltage becomes lower than at least one reference voltage, the first operational amplifier allows the first transistor to operate so as to raise the output voltage, and the second operational amplifier receives the output voltage at the input terminal, when the level of the output voltage exceeds at least one reference voltage, the second operational amplifier allows second transistor to operate so as to lower the output voltage.

Further, according to the first aspect of the present invention, the first and second operational amplifiers includes a first current mirror circuit and a second current mirror circuit respectively, and each of the first and second operational amplifiers are connected to a pair of transistors functioning as a differential amplifier respectively; the reference voltage is applied to a gate of one of said pair of transistors in each of the first and second operational amplifiers, and the output voltage is applied to a gate of the other transistor of the pair of transistors, and the voltage at an output terminal of each of the first and second operational amplifiers is output from a drain of one of the pair of transistors.

Furthermore, a gate of the first transistor is connected to the output terminal of the first operational amplifier, and a source and a drain thereof are connected to a first power supply for providing a voltage higher than the reference voltage, and to a common node, respectively; a gate of said second transistor is connected to the output terminal of the second operational amplifier, and a drain and a source thereof are connected to the common node, and to a second power supply for providing a voltage lower than the reference voltage, respectively; and the common node output the output voltage, and is connected to a gate of the other transistor of the pair of transistors in each of the first and second operational amplifiers.

Further, according to the second aspect of the present invention, the semiconductor integrated circuit further comprises adjusting resistors for shifting the level of the output voltage, and the common node is connected to a gate of the other transistor of the pair of transistors in each of the first and second operational amplifiers, via the adjusting resistors.

Further, according to the third aspect of the present invention, the reference voltages include a first reference voltage and second reference voltage having mutually different levels, and the first reference voltage is applied to one of the pair of transistor in the first operational amplifier, and the second reference voltage is applied to one of the pair of transistor in the second operational amplifier.

Furthermore, according to the third aspect of the present invention, the semiconductor integrated circuit further comprises adjusting resistors for shifting the level of the output voltage, and the common node is connected to a gate of the other transistor of the pair of transistors in each of the first and second operational amplifiers, via the adjusting transistors; and the level of the first reference voltage is always set to a smaller value than that of the second reference voltage.

Further, preferably, in the semiconductor integrated circuit according to the present invention, the pair of transistors in each of the first and second operational amplifiers are a first conductivity type of transistor; and the first transistor is a second conductivity type of transistor, and the second transistor is the first conductivity type of transistor.

Further, preferably, in the semiconductor integrated circuit according to the present invention, a penetrating current suppressing diode is interposed between the second transistor and second power supply.

Further, preferably, in the semiconductor integrated circuit according to the present invention, the pair of transistors in the first current mirror circuit are a first conductivity of transistor type, and the pair of transistors in the second current mirror circuit are a second conductivity of transistor type; and the first transistor is the second conductivity type of transistor, and the second transistor is the first conductivity type of transistor.

When the first transistor is operating, the second operational amplifier controls the second transistor to a non-operating state, and a penetrating current is thus prevented from flowing from the first power supply to the second power supply, through the first transistor and second transistor.

Further, preferably, a constant voltage generation circuit according to the present invention comprises a reference voltage generation circuit for providing a reference voltage; an output terminal for providing an output signal; a first detection circuit and a second detection circuit for outputting a first control signal and a second control signal in response to a difference between the reference voltage and a voltage of the output voltage; a first transistor disposed between a first voltage supply source and the output terminal, a conductance of which is controlled by the first control signal; and a second transistor disposed between the output terminal and a second voltage supply source, a conductance of which is controlled by the second control signal.

Further, preferably, in the constant voltage generation circuit according to the present invention, each of the first and second detection circuits comprises a pair of transistors, gates of which receive the input signals, and drains of which are commonly coupled to the second voltage supply source; and a current mirror circuit disposed between the first voltage supply source and the pair of transistors. In such a configuration, the first and second control signals are output respectively from connection nodes between corresponding current mirror circuit and corresponding pair of transistors.

Further, preferably, the constant voltage generation circuit according to the present invention further includes a voltage shift circuit disposed between the output terminal and input terminals of the first and second detection circuits.

Further, preferably, in the constant voltage generation circuit according to the present invention, the reference voltage generation circuit provides first and second reference voltages having different voltages, and the first detection circuit is responsive to the first reference voltage, and the second detection circuit is responsive to the second reference voltage.

Further, preferably, in the constant voltage generation circuit according to the present invention, each of the first and second detection circuits comprises a current mirror circuit, coupled to the first voltage supply source, for receiving the reference voltage and the output signal, respectively, and the first and second control signals are output respectively from connection nodes between the first voltage supply source and the current mirror circuit.

Further, in the constant voltage generation circuit according to the present invention, the pair of transistors in the first detection circuit are NMOS transistors, and the pair of transistors in the second detection circuit are PMOS transistors.

Further, in the constant voltage generation circuit according to the present invention, the output terminal is coupled to at least one of bit lines and cell capacitors in a dynamic random access memory.

Further, preferably, in the constant voltage generation circuit according to the present invention, the output signal having a voltage which is a half of a voltage between the first and second voltage supply sources.

According to the semiconductor integrated circuit of the present invention, the gates of the first transistor and second transistor (Hereinafter, the first transistor and the second transistor will be referred to as a first output transistor and a second output transistor, respectively, for the convenience of explanation) are connected to the drains of the transistors included in the first operational amplifier and second operational amplifier, respectively. Unlike conventional semiconductor integrated circuits, the first and second output transistors do not operate as a source follower. Assuming that a reference voltage is nearly equal to a half of a supply voltage, the threshold voltage between the gate and source of a transistor in the first operational amplifier, required at the minimum for allowing a current to flow through the source and drain of this transistor, is subtracted from the reference voltage. The resultant voltage obtained by the above subtraction is amplified by the first operational amplifier, and input to the first output transistor. In contrast, assuming that a reference voltage is nearly equal to a half of a supply voltage, the threshold voltage between the gate and source of a transistor in the second operational amplifier, required at the minimum for allowing a current to flow through the source and drain of this transistor, is subtracted from the reference voltage. The resultant voltage obtained by the above subtraction is amplified by the second operational amplifier and input to the second output transistor.

In the semiconductor integrated circuit of the present invention, an influence on the output voltage given by the threshold voltage between the gate and source of a MOS transistor in an operational amplifier is relatively small compared with the case in any conventional semiconductor integrated circuit. Even when the supply voltage is 2 V or lower than 2 V, the first and second output transistors operate stably. This results in an increase in an operating margin of the output transistors.

Thus, in the semiconductor integrated circuit of the present invention, even when the supply voltage is lowered, the driving ability of the output transistors can be exerted fully. A voltage used to precharge bit lines or a voltage which is to be applied to a cell plate node of a cell capacitor in a memory cell can be generated stably.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Referring now to the appended drawings (FIGS. 7 to 14), the basic embodiment and preferred embodiments of the present invention will be described below.

Figure 7:
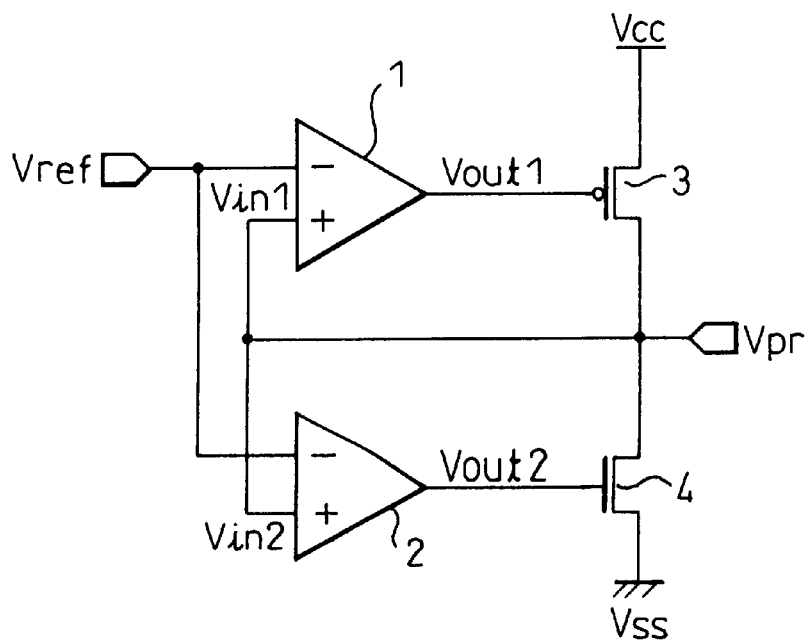
FIG. 7 is a circuit diagram showing a configuration of a basic embodiment based on the principle of the present invention.

FIG. 7 is a block diagram showing a configuration of a basic embodiment based on the principle of the present invention. Herein, a configuration of a semiconductor integrated circuit of the present invention having an ability to produce a constant voltage will be shown schematically.

The semiconductor integrated circuit in accordance with the basic embodiment shown in FIG. 7 consists of a first operational amplifier 1 and a second operational amplifier 2. The first operational amplifier 1 amplifies a voltage difference between a first input voltage Vin1 and a reference voltage Vref, and outputs a first amplified voltage Vout1. The second operational amplifier 2 amplifies a voltage difference between a second input voltage Vin2 and the reference voltage Vref, and output a second amplified voltage Vout2.

Furthermore, the semiconductor integrated circuit in accordance with the basic embodiment shown in FIG. 7 includes a first output transistor 3 and a second output transistor 4. The first output transistor 3 is turned ON or OFF according to the level of the first amplified voltage Vout1 output from the first operational amplifier 1. The first output transistor 3 thus adjusts the level of an intended output voltage (for example, a constant voltage corresponding to a half of a supply voltage Vcc) Vpr, and outputs the resultant output voltage Vpr. The second output transistor 4 is turned ON or OFF according to the level of the second amplified voltage Vout2 output from the second operational amplifier 2. The second output transistor 4 thus adjusts the level of the output voltage Vpr, and outputs the resultant output voltage Vpr. Furthermore, the output voltage Vpr output from the first or second output transistor 3 or 4 through the drain thereof is fed back to one of input terminals of each of the first operational amplifier 1 and second operational amplifier 2.

Furthermore, in FIG. 7, the first output transistor 3 is realized by a PMOS transistor, while the second output transistor 4 is realized by an NMOS transistor. The source of the first output transistor 3 is connected to a first power supply (i.e., first voltage supply source) that provides the supply voltage Vcc higher than the reference voltage Vref. The drain of the first output transistor 3 is connected to a common node through which the output voltage Vpr is output. The source of the second output transistor 4 is connected to a second power supply (i.e., second voltage supply source) that provides a supply voltage Vss (=0 V) lower than the reference voltage Vref. The drain of the second output transistor 4 is connected to the common node, and the gate thereof is connected to the output terminal of the second operational amplifier 4.

In the circuitry shown in FIG. 7, the output voltage Vpr (that is, a voltage fed back to one input terminal of the first operational amplifier 1 through the common node) is applied to the common node. When the output voltage Vpr becomes lower than the reference voltage Vref, the first operational amplifier 1 outputs an amplified voltage of "L" level. When the output voltage Vpr becomes higher than the reference voltage Vref, the first operational amplifier 1 output an amplified voltage of "H" level. The amplified voltage of "L" level or "H" level is applied to the gate of the PMOS transistor 3. When the amplified voltage of "L" level is applied, that is, when the output voltage Vpr is lower than the reference voltage Vref, the first output transistor 3 realized by a PMOS transistor is turned ON. This causes the output voltage Vpr to rise until the output voltage becomes equal to the level of the reference voltage Vref. At this time, the second output transistor 4 realized by an NMOS transistor is turned OFF because of the amplified voltage of "L" level.

In contrast, when the amplified voltage of "H" level is applied, that is, when the output voltage Vpr is higher than the reference voltage Vref, the second output transistor 4 realized by an NMOS transistor is turned ON. This causes the output voltage Vpr to be lowered until the output voltage becomes equal to the level of the reference voltage Vref. At this time, the first output transistor 3 realized by a PMOS transistor is turned OFF because of the amplified voltage of "H" level. In other words, the above first and second operational amplifiers function as detecting circuits for detecting the difference between the reference voltage Vref and the output voltage Vpr.

In the aforesaid basic embodiment, an influence on the output voltage given by the threshold voltage between the gate and source of a MOS transistor in an operational amplifier becomes smaller than that in any conventional semiconductor integrated circuit. Even when the supply voltage falls (for example, the supply voltage becomes equal to or lower than 2 V), the driving ability of the first and second output transistors can be exerted fully. A constant voltage corresponding to a half of the supply voltage Vcc can be produced stably.

Figure 8:
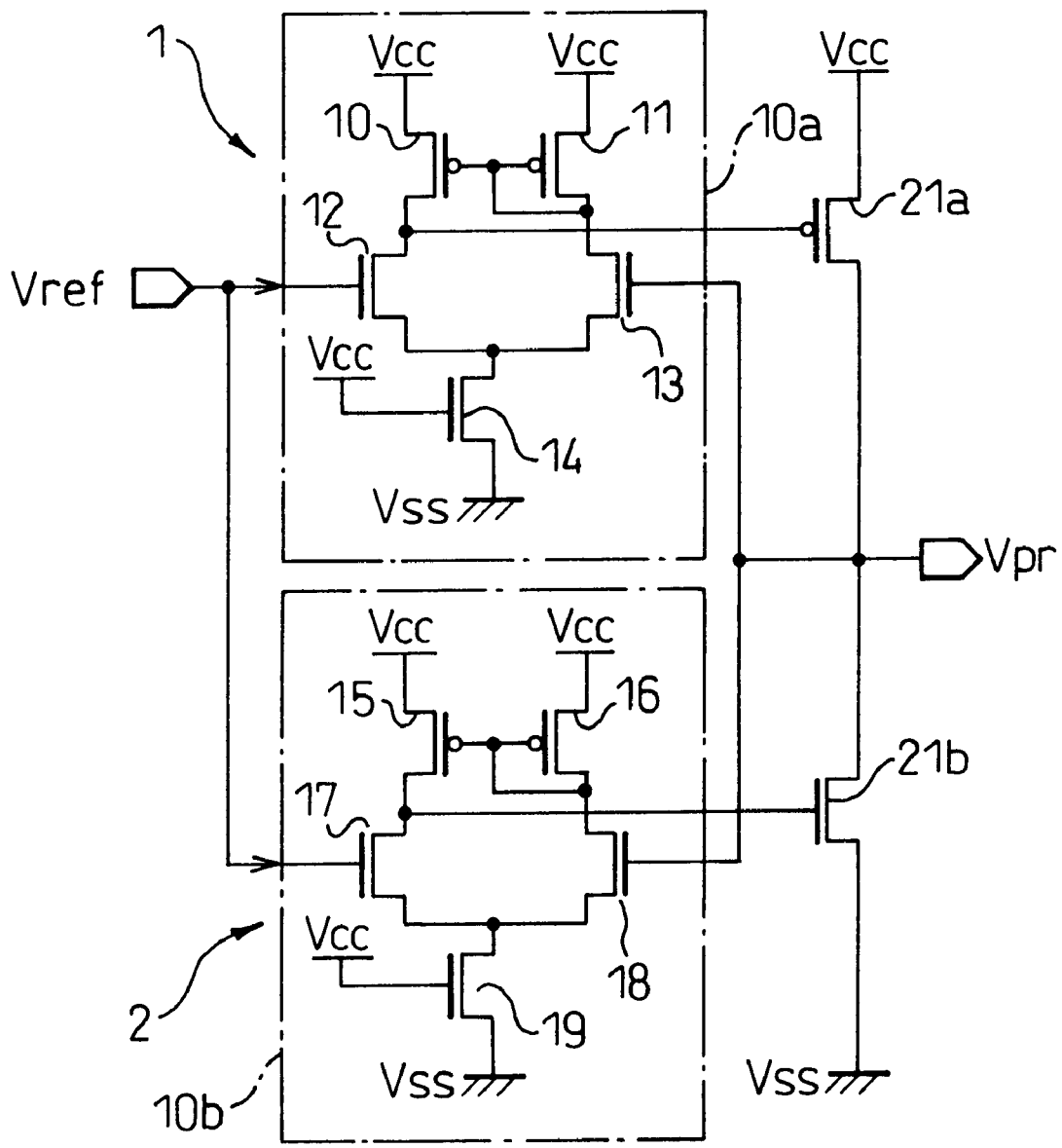
FIG. 8 is a circuit diagram showing a configuration of the first preferred embodiment of the present invention.

FIG. 8 is a circuit diagram showing a configuration of the first preferred embodiment of the present invention. Shown is only a configuration of a constant voltage generating circuit in a semiconductor integrated circuit which relates to the present invention. Hereinafter, the same reference numerals will be assigned to components identical to those described previously.

In the embodiment shown in FIG. 8, a first operational amplifier 1 (See FIG. 7) in accordance with the present invention is realized by an operational amplifier with a first current mirror circuit 10a for amplifying a voltage difference between an input voltage and reference voltage Vref. A second operational amplifier 2 in accordance with the present invention is realized by an operational amplifier with a second current mirror circuit 10b for amplifying a voltage difference between the input voltage and reference voltage Vref. The operational amplifier with the first current mirror circuit 10a and the operational amplifier with the second current mirror circuit 10b have the same circuit configuration.

In FIG. 8, the operational amplifier with the first current mirror circuit 10a is composed of a pair of NMOS transistors 12 and 13, an NMOS transistor 14, and two PMOS transistors 10 and 11. Herein, the pair of NMOS transistors 12 and 13 function as a differential amplifier. The NMOS transistor 14 functions as a current source for the whole operational amplifier with the current mirror circuit. The PMOS transistors 10 and 11 connected with each other in a current mirror connected form are used to adjust a current flowing into one of the paired NMOS transistors 12 and 13, that is, the NMOS transistor 12 (i.e., these PMOS transistors 10 and 11 constitute a first current mirror circuit). On the other hand, the second current mirror circuit 10b is composed of a pair of NMOS transistors 17 and 18, an NMOS transistor 19, and two PMOS transistors 15 and 16. The pair of NMOS transistors 17 and 18 function as a differential amplifier. The NMOS transistor 19 functions as a current source for the whole operational amplifier with the current mirror circuit. The two PMOS transistors 15 and 16 connected with each other in a current mirror connected form are used to adjust a current flowing into one of the pair of NMOS transistors 17 and 18, that is, the NMOS transistor 17 (i.e., these PMOS transistor 15, 16 constitute a second current mirror circuit).

In FIG. 8, the reference voltage Vref is applied to the gate of one of the paired NMOS transistors 12 and 13 in the operational amplifier with the first current mirror circuit 10a, that is, to the gate of the NMOS transistor 12. A voltage difference between the output voltage Vpr (for example, a voltage corresponding to a half of the supply voltage Vcc) and reference voltage Vref is amplified. The thus amplified voltage is output through the drain of the NMOS transistor 12. The drain of the NMOS transistor 12 that is one of the pair of NMOS transistors 12 and 13 is connected to the gate of the first output transistor 21a realized by a PMOS transistor. The first output transistor 21a has substantially the same function as the first output transistor 3 shown in FIG. 7.

In FIG. 8, the reference voltage Vref is applied to the gate of one of the pair of NMOS transistors 12 and 13 in the operational amplifier with the first current mirror circuit 10a, that is, to the gate of the NMOS transistor 12. A voltage difference between the output voltage Vpr (for example, a voltage corresponding to a half of the supply voltage Vcc) and reference voltage Vref is amplified. The thus amplified voltage is output through the drain of the NMOS transistor 12. The drain of the NMOS transistor 12 that is one of the pair of NMOS transistors 12 and 13 is connected to the gate of the first output transistor 21a realized by a PMOS transistor. The first output transistor 21a has substantially the same function as the first output transistor 3 shown in FIG. 7.

On the other hand, the reference voltage Vref is applied to the gate of one of the paired NMOS transistors 17 and 18 in the operational amplifier with the second current mirror circuit 10b, that is, to the gate of the NMOS transistor 17. Herein, the reference voltage Vref is identical to the foregoing reference voltage. A voltage difference between the output voltage Vpr and reference voltage Vref is amplified. The thus amplified voltage is output through the drain of the NMOS transistor 17. The drain of the NMOS transistor 17 that is one of the paired NMOS transistors 17 and 18 is connected to the gate of a second output transistor 21b that is an NMOS transistor. The second output transistor 21b has substantially the same function as the second output transistor 4 shown in FIG. 7.

Furthermore, in FIG. 8, the source of the first transistor 21a is connected to the first power supply that provides the supply voltage Vcc higher than the reference voltage Vref. The drain of the first output transistor 21a is connected to the common node, and the source thereof is connected to the second power supply for providing the supply voltage Vss lower than the reference voltage Vref. The drain of the second output transistor 21b is connected to the common node. The common node is connected to the gate of the NMOS transistor 13 in the operational amplifier with the first current mirror circuit and to the gate of the NMOS transistor 18 in the operational amplifier with the second current mirror circuit. According to the level of the voltage applied to the gate of the first output transistor 21a, the output voltage Vpr is output through the source of the first output transistor 21a. The output voltage Vpr is fed back to the gate of the NMOS transistor 13 through the common node. On the other hand, the output voltage Vpr is output through the source of the second output transistor 22b according to the level of the voltage applied to the gate of the second output transistor 22b. The output voltage Vpr is fed back to the gate of the NMOS transistor 18 through the common node.

Furthermore, in FIG. 8, assume that the output voltage Vpr becomes lower than the reference voltage Vref. In this case, the voltage between the gate and source of the NMOS transistor 13 in the operational amplifier with the first current mirror circuit 10a is lowered, and a current which is to be supplied from the PMOS transistor 11 to the NMOS transistor 13 decreases. A current flowing throughout the operational amplifier with the first current mirror circuit 10a is determined by the NMOS transistor 14 functioning as a current source. When the current supplied from the PMOS transistor 11 to the NMOS transistor 13 decreases, a current which is to be supplied from the PMOS transistor 10 to the NMOS transistor 12 increases. This causes the potential at the drain of the NMOS transistor 12, that is, the potential at the gate of the first output transistor 21a that is a PMOS transistor, to be lowered. As a result, the voltage between the gate and source of the first output transistor 21a exceeds the threshold voltage. Consequently, the first output transistor 21a enters an operating state (ON state), and operates to raise the output voltage until the output voltage becomes equal to the level of the reference voltage.

Furthermore, in this case, the voltage between the gate and source of the other NMOS transistor 18 in the operational amplifier with the second current mirror circuit 10b is lowered, and a current which is to be supplied from the PMOS transistor 16 to the NMOS transistor 18 decreases. A current flowing throughout the operational amplifier with the second current mirror circuit 10b is determined by the NMOS transistor 19 functioning as a current source. When the current which is to be supplied from the PMOS transistor 16 to the NMOS transistor 18 decreases, a current which is to be supplied from the PMOS transistor 15 to the NMOS transistor 17 increases. This causes the potential at the drain of the NMOS transistor 17, that is, the potential at the gate of the second output transistor 21b that is an NMOS transistor, to be lowered. As a result, the voltage between the gate and source of the second output transistor 21b becomes lower than the threshold voltage. Consequently, the second output transistor 21b enters a non-operating state (OFF state).

In contrast, assume that the output voltage Vpr becomes higher than the reference voltage Vref. In this case, the voltage between the gate and source of the other NMOS transistor 18 in the operational amplifier with the second current mirror circuit 10b rises. Consequently, a current which is to be supplied from the PMOS transistor 16 to the NMOS transistor 18 increases. A current which is to be supplied from the PMOS transistor 15 to the NMOS transistor 17 decreases accordingly. This causes the potential at the drain of the NMOS transistor 17, that is, the potential at the gate of the second output transistor 21b that is an NMOS transistor, to rise. As a result, the voltage between the gate and source of the second output transistor 21b exceeds the threshold voltage. Consequently, the second output transistor 21b enters an operating state (ON state), and operates to raise the output voltage until the output voltage becomes equal to the level of the reference voltage.

Furthermore, in this case, the voltage between the gate and source of the other NMOS transistor 13 in the operational amplifier with the first current mirror circuit 10a rises, and a current which is to be supplied from the PMOS transistor 11 to the NMOS transistor 13 increases. A current which is to be supplied from the PMOS transistor 10 to the NMOS transistor 12 decreases accordingly. This causes the potential at the drain of the NMOS transistor 12, that is, the potential at the gate of the first output transistor 21a that is a PMOS transistor, to rise. As a result, the voltage between the gate and source of the first output transistor 21a becomes lower than the threshold voltage. Consequently, the first output transistor 21a enters a non-operating state (OFF state).

In the first preferred embodiment, the reference voltage Vref is nearly equal to a half of the supply voltage Vcc. The threshold voltage Vth between the gate and source of the NMOS transistor 12 in the operational amplifier with the first current mirror circuit 10a is subtracted from the reference voltage Vref. The resultant voltage obtained by the above subtraction is an input voltage of the NMOS transistor 12. In short, the input voltage Vcc/2 depends only on the threshold voltage Vth of one MOS transistor. In the first embodiment, therefore, an influence on the output voltage given by the threshold voltage between the gate and source of a MOS transistor becomes smaller than that in any conventional semiconductor integrated circuit. Even when the supply voltage is equal to or lower than 2 V, the first and second output transistors operate stably. This leads to an increase in an operating margin of the output transistors.

Figure 9:
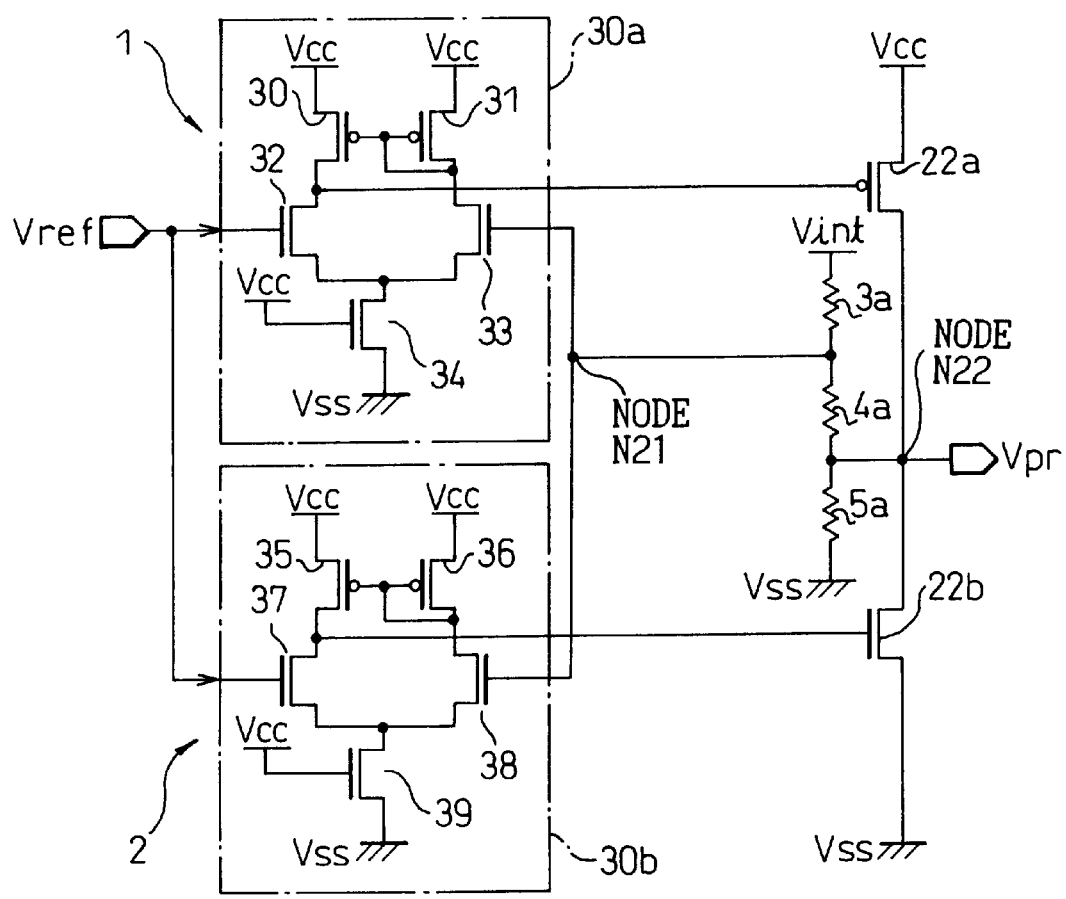
FIG. 9 is a circuit diagram showing a configuration of the second preferred embodiment of the present invention.

FIG. 9 is a circuit diagram showing a configuration of the second preferred embodiment of the present invention. The configuration is identical to that of the first embodiment, and further includes a plurality of constant voltage generating resistors (divider resistors) 3a, 4a, and 5a. The plurality of resistors 3a, 4a, and 5a are used to produce an output voltage Vpr lower than the reference voltage Vref. In the first embodiment, when the reference voltage Vref is very low, the operational amplifier with the current mirror circuits may not operate. The second preferred embodiment shown in FIG. 9 is provided with the plurality of constant voltage generating resistors 3a to 5a even if the operational amplifier with the current mirror circuits do not operate.

In the embodiment shown in FIG. 9, the configuration of an operational amplifier with a first current mirror circuit 30a and an operational amplifier with a second current mirror circuit 30b is identical to that of the operational amplifiers with the current mirror circuits in the first embodiment. Specifically, a first operational amplifier 1 in accordance with the present invention is realized by the operational amplifier with the first current mirror circuit 30a for amplifying a voltage difference between an input voltage and reference voltage Vref. A second operational amplifier in accordance with the present invention is realized by the operational amplifier with the second current mirror circuit 30b for amplifying a voltage difference between the input voltage and reference voltage Vref. The operational amplifier with the first current mirror circuit 30a and the operational amplifier with the second current mirror circuit 30b have the same circuit configuration.

In FIG. 9, the operational amplifier with first current mirror circuit 30a is composed of a pair of NMOS transistors 32 and 33, an NMOS transistor 34, and two PMOS transistors 30 and 31. The pair of NMOS transistors 32 and 33 function as a differential amplifier. The NMOS transistor 34 functions as a current source for the whole operational amplifier with the current mirror circuit. The PMOS transistors 30 and 31 connected with each other in a current mirror connected form are used to adjust a current flowing into one of the pair of NMOS transistors 32 and 33, that is, the NMOS transistor 32. On the other hand, the operational amplifier with the second current mirror circuit 30b is composed of a pair of NMOS transistors 37 and 38, an NMOS transistor 39, and two PMOS transistors 35 and 36. The pair of NMOS transistors 37 and 38 function as a differential amplifier. The NMOS transistor 37 functions as a current source for the whole operational amplifier with the current mirror circuit. The PMOS transistors 35 and 36 connected with each other in a current mirror connected form are used to adjust a current flowing into one of the pair of NMOS transistors 37 and 38, that is, the NMOS transistor 37.

Furthermore, in FIG. 9, the reference voltage Vref is applied to the gate of one of the paired NMOS transistors 32 and 33 in the operational amplifier with the first current mirror circuit 30a, that is, the gate of the NMOS transistor 32. A difference between a voltage at a node N21 (for example, a voltage corresponding to a half of a supply voltage Vcc) and the reference voltage Vref is amplified. The thus amplified voltage is output through the drain of the NMOS transistor 32. The drain of the NMOS transistor 32 that is one of the pair of NMOS transistors 32 and 33 is connected to the gate of a first output transistor 22a that is a PMOS transistor. The first output transistor 22a has substantially the same function as the first output transistor 21a shown in FIG. 8.

On the other hand, the reference voltage Vref is applied to the gate of one of the pair of NMOS transistors 37 and 38 in the operational amplifier with the second current mirror circuit 30b, that is, to the gate of the NMOS transistor 37. Herein, the reference voltage Vref is identical to the foregoing reference voltage. A voltage difference between the voltage at the node N21 and the reference voltage Vref is amplified. The thus amplified voltage is output through the drain of the NMOS transistor 37. The drain of the NMOS transistor 37 that is one of the pair of NMOS transistors 37 and 38 is connected to the gate of a second output transistor 22b that is an NMOS transistor. The second output transistor 22b has substantially the same function as the second output transistor 21b shown in FIG. 8.

Furthermore, in FIG. 9, the source of the first output transistor 22a is connected to a first power supply that provides a supply voltage Vcc higher than the reference voltage Vref. The drain of the first output transistor 22a is connected to a common node N22, and the source thereof is connected to a second power supply that provides a supply voltage Vss lower than the reference voltage Vref. The drain of the second output transistor 22b is connected to the common node N22. The common node N22 is connected to the gate of the other NMOS transistor 33 in the operational amplifier with the first current mirror circuit and to the gate of the other NMOS transistor 38 in the operational amplifier with the second current mirror circuit, via a constant voltage generating resistor 4a. An output voltage Vpr is output through the drain of the first output transistor 22 according to the level of a voltage applied to the gate of the first output transistor 22a. The output voltage Vpr is fed back to the gate (node N21) of the NMOS transistor 33 through the common node N22 by way of the constant voltage generating resistor 4a. An output voltage Vpr is output through the source of the second output transistor 22b according to the level of a voltage applied to the gate of the second output transistor 22b. The output voltage Vpr is fed back to the gate of the NMOS transistor 38 through the common node N22 by way of the constant voltage generating resistor 4a.

Furthermore, in FIG. 9, assuming that the voltage developed at the node N21 becomes lower than the reference voltage Vref, the voltage between the gate and source of the other NMOS transistor 33 in the operational amplifier with the first current mirror circuit 30a falls, and a current which is to be supplied from the PMOS transistor 31 to the NMOS transistor 33 decreases. A current flowing throughout the operational amplifier with the first current mirror circuit 30a is determined by the NMOS transistor 34 functioning as a current source. When the current which is to be supplied from the PMOS transistor 31 to the NMOS transistor 33 decreases, a current which is to be supplied from the PMOS transistor 30 to the NMOS transistor 32 increases. This causes the potential at the drain of the NMOS transistor 32, that is, the potential at the gate of the first output transistor 22a that is a PMOS transistor, to be lowered. As a result, the voltage between the gate and source of the first output transistor 22a exceeds the threshold voltage. The first output transistor gets operating, and operates to raise the voltage at the node N21 until this voltage becomes equal to the level of the reference voltage.

In this case, the voltage between the gate and source of the other NMOS transistor 38 in the operational amplifier with the second current mirror circuit 30b falls, and a current which is to be supplied from the PMOS transistor 36 to the NMOS transistor 38 decreases. A current flowing throughout the operational amplifier with the second current mirror circuit 30b is determined by the NMOS transistor 39 functioning as a current source. When the current which is to be supplied from the PMOS transistor 36 to the NMOS transistor 38 decreases, a current which is to be supplied from the PMOS transistor 35 to the NMOS transistor 37 increases. This causes the potential at the drain of the NMOS transistor 37, that is, the potential at the gate of the second output transistor 22b that is an NMOS transistor, to be lowered. As a result, the voltage between the gate and source of the second output transistor 22b becomes lower than the threshold voltage. Consequently, the second output transistor 22b enters a non-operating state.

In contrast, assume that the voltage developed at the node N21 becomes higher than the reference voltage Vref. In this case, the voltage between the gate and source of the other NMOS transistor 38 in the operational amplifier with the second current mirror circuit 30b rises, and a current which is to be supplied from the PMOS transistor 36 to the NMOS transistor 38 increases. A current which is to be supplied from the PMOS transistor 35 to the NMOS transistor 37 decreases accordingly. This causes the potential at the drain of the NMOS transistor 37, that is, the potential at the gate of the second output transistor 22b that is an NMOS transistor, to be lowered. As a result, the voltage between the gate and source of the second output transistor 22b exceeds the threshold voltage. Consequently, the second output transistor 22b enters an operating state, and operates to lower the voltage developed at the node N21 until this voltage becomes equal to the level of the reference voltage.

In this case, the voltage between the gate and source of the NMOS transistor 33 in the operational amplifier with the first current mirror circuit 30a rises, and a current which is to be supplied from the PMOS transistor 31 to the NMOS transistor 33 increases. A current which is to be supplied from the PMOS transistor 30 to the NMOS transistor 32 decreases accordingly. This causes the potential at the drain of the NMOS transistor 32, that is, the potential at the gate of the first output transistor 22a that is a PMOS transistor, to rise. As a result, the voltage between the gate and source of the first output transistor 22a becomes lower than the threshold voltage. Consequently, the first output transistor 22a enters a non-operating state.

In the embodiment shown in FIG. 9, the three constant voltage generating resistors 3a, 4a, and 5a connected in series with each other are used to produce a fraction of an internal supply voltage Vint. Thus, the output voltage Vpr having a lower level than the reference voltage Vref is produced. To be more specific, the voltage at the node N21 is substantially equal to the reference voltage Vref. Herein, the node N21 coincides with the junction between the constant voltage generating resistor 3a offering a resistance r1 and the constant voltage generating resistor 4a offering a resistance r2. The output voltage Vpr lower than the reference voltage Vref is developed at the common node N22. The common node N22 coincides with the junction between the constant voltage generating resistor 4a offering the resistance r2 and the constant voltage generating resistor 5a offering a resistance r3.

In summary, when the voltage at the node N21 is lower than the reference voltage Vref, the potential at the drain of the NMOS transistor 32 in the operational amplifier with the first current mirror circuit 30a is lowered. The first output transistor 22a therefore operates to raise the output voltage at the node N22.

In contrast, when the voltage at the node N21 is higher than the reference voltage Vref, the potential at the drain of the NMOS transistor 37 in the operational amplifier with the second current mirror circuit 30b rises. The second output transistor 22b therefore operates to lower the output voltage at the node N22.

Assuming that the voltage at the node N21 is Vg, the relationship represented by Vg=Vref is established. The relationship between the reference voltage Vref and output voltage Vpr is expressed by the following equation (3):

$$Vpr = r3 \cdot Vref/(r2+r3) \quad (3)$$

In short, according to the second embodiment, the operational amplifier with first current mirror circuit 30a and the operational amplifier with second current mirror circuit 30b drive the first output transistor 22a and second output transistor 22b, respectively, so that the voltage Vg at the node N21 will be equal to the reference voltage Vref. At this time, the voltage Vg at the node N21, and the resistance offered by the constant voltage generating resistors 3a to 5a connected to the common node N22 are set to appropriate levels. The reference voltage Vref is set to a level for enabling the operational amplifiers with the current mirror circuits to operate readily. Besides, the output voltage Vpr can reliably be set to a desired level lower than the reference voltage Vref.

Figure 10:
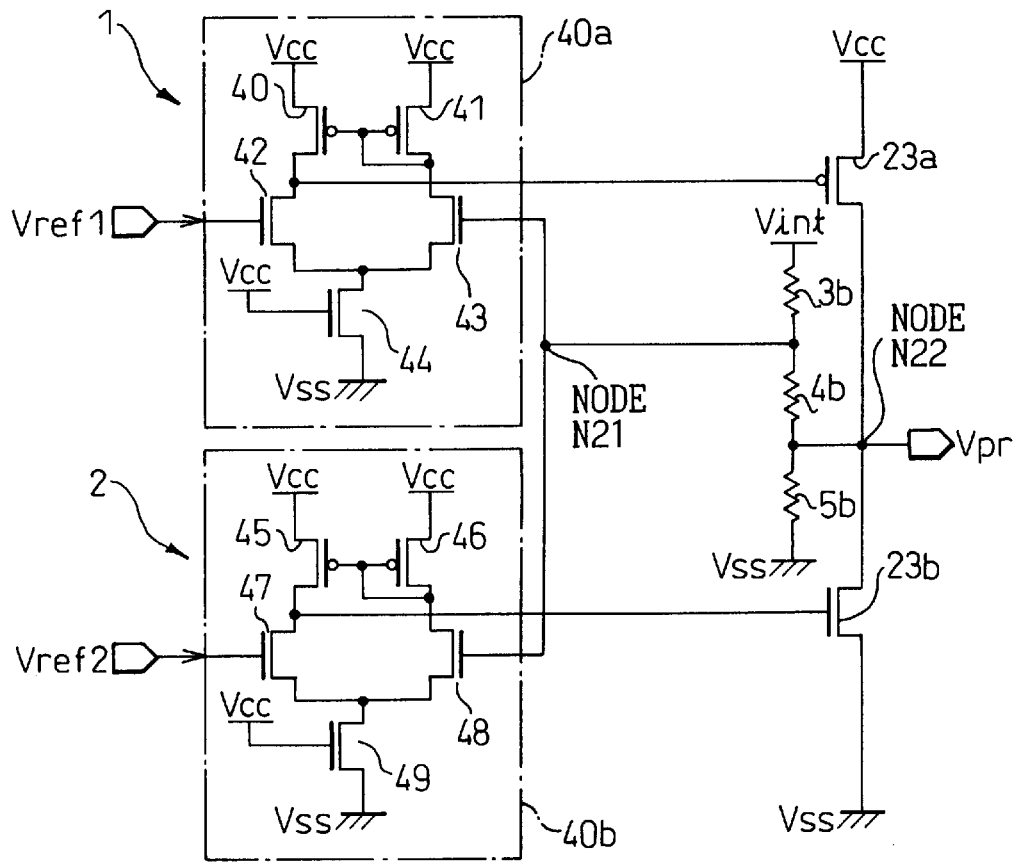
FIG. 10 is a circuit diagram showing a configuration of the third preferred embodiment of the present invention.

FIG. 10 is a circuit diagram showing a configuration of the third preferred embodiment of the present invention. A semiconductor integrated circuit of the third preferred embodiment is identical to that of the second embodiment except that a dead zone is specified to stably detect the level of an output voltage Vpr.

As shown in FIG. 10, if the common reference voltage Vref is input to the first operational amplifier and second operational amplifier, there arises a disadvantage that a penetrating current may flow. The penetrating current penetrates through the first output transistor and second output transistor. The third embodiment shown in FIG. 10 attempts to cope with this kind of disadvantage. Namely, a first reference voltage Vref1 and second reference voltage Vref2 of different levels are input to the first and second operational amplifiers, respectively. When the output voltage Vpr falls within a certain range of levels, two output transistors enter non-operating states. For specifying the dead zone accurately, the relationship of Vref1<Vref2 must be established.

In the embodiment shown in FIG. 10, the configuration of an operational amplifier with a first current mirror circuit 40a and an operational amplifier with a second current mirror circuit 40b is identical to that of the operational amplifiers with the current mirror circuits in the second embodiment. Specifically, a first operational amplifier 1 in accordance with the present invention is realized by the operational amplifier with the first current mirror circuit 40a for amplifying a voltage difference between an input voltage and the first reference voltage Vref. On the other hand, a second operational amplifier 2 in accordance with the present invention is realized by the operational amplifier with the second current mirror circuit 40b for amplifying a voltage difference between the input voltage and second reference voltage Vref2. The operational amplifier with the first current mirror circuit 40a and the operational amplifier with the second current mirror circuit 40b have the same circuit configuration.

Furthermore, in FIG. 10, the operational amplifier with the first current mirror circuit 40a consists of a pair of NMOS transistors 42 and 43, an NMOS transistor 44, and two PMOS transistors 40 and 41. Herein, the pair of NMOS transistors 42 and 43 function as a differential amplifier. The NMOS transistor 44 functions as a current source for the whole operational amplifier with the current mirror circuit. The PMOS transistors 40 and 41 connected with each other in a current mirror connected form are used to adjust a current flowing into one of the pair of NMOS transistors 42 and 43, that is, the NMOS transistor 42. On the other hand, the operational amplifier with the second current mirror circuit 40b consists of a pair of NMOS transistors 47 and 48, an NMOS transistor 49, and two PMOS transistors. Herein, the pair of transistors 47 and 48 function as a differential amplifier. The NMOS transistor 49 functions as a current source for the whole operational amplifier with the current mirror circuit. The PMOS transistors 45 and 46 connected with each other in a current mirror connected form are used to adjust a current flowing into one of the pair of NMOS transistors 47 and 48, that is, the NMOS transistor 47.

Figure 1:
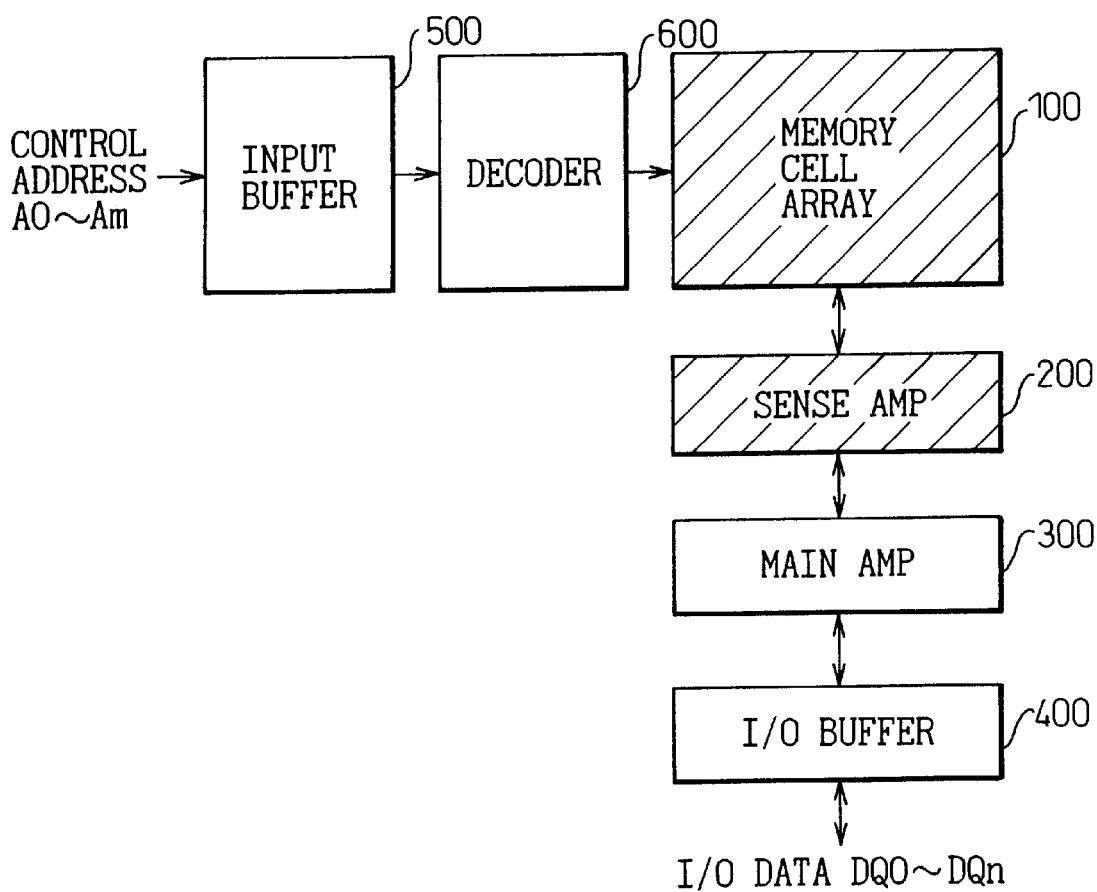
FIG. 1 is a block diagram showing an outline configuration of a typical DRAM.
Figure 2:
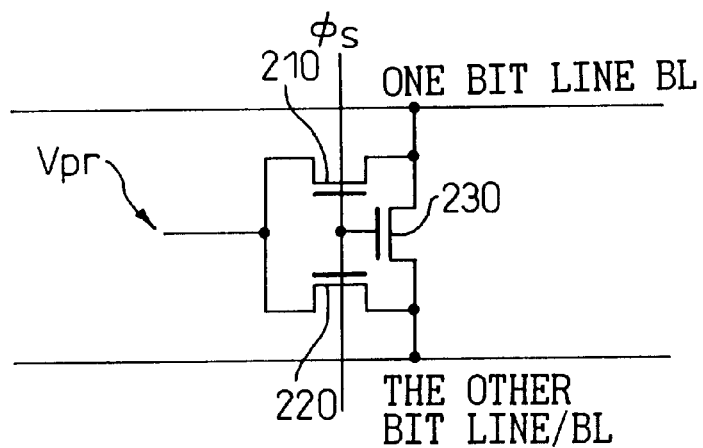
FIG. 2 is a circuit diagram showing an exemplary configuration of a bit line precharging circuit in a sense amplifier shown in FIG. 1.

Furthermore, in FIG. 10, the first reference voltage Vref1 is applied to the gate of one of the pair of NMOS transistors 42 and 43 in the operational amplifier with the first current mirror circuit 40a, that is, to the gate of the NMOS transistor 42. A potential difference between a voltage at a node N21 (for example, a voltage corresponding to a half of a supply voltage Vcc) and the first reference voltage Vref1 is amplified. The thus amplified voltage is output through the drain of the NMOS transistor 42. The drain of the NMOS transistor 42, that is one of the pair of NMOS transistors 42 and 43, is connected to the gate of a first output transistor 23a that is a PMOS transistor. The first output transistor 23a has substantially the same function as the first output transistor 21a shown in FIG. 2.

On the other hand, the second reference voltage Vref2 is applied to the gate of one of the pair of NMOS transistors 47 and 48 in the operational amplifier with the second current mirror circuit 40b, that is, the gate of the NMOS transistor 47. A voltage difference between the voltage at the node N21 and the second reference voltage Vref2 is amplified. The thus amplified voltage is output through the drain of the NMOS transistor 47. Furthermore, the drain of the NMOS transistor 47 that is one of the pair of NMOS transistors 47 and 48 is connected to the gate of a second output transistor 23b that is an NMOS transistor. The second output transistor 23b has substantially the same function as the second output transistor 21b shown in FIG. 8.

Furthermore, in FIG. 10, the source of the first output transistor 23a is connected to a first power supply for providing a supply voltage Vcc higher than the second reference voltage Vref2. The drain of the first output transistor 22a is connected to a common node N22. On the other hand, the source of the second output transistor 23b is connected to a second power supply for providing a supply voltage Vss lower than the first reference voltage Vref1. The drain of the second output transistor 23b is connected to the common node N22. The common node N22 is connected to the gate of the other NMOS transistor 43 in the operational amplifier with the first current mirror circuit, via a constant voltage generating resistor 4b that will be described later. The common node N22 is also connected to the gate of the other NMOS transistor 48 in the operational amplifier with the second current mirror circuit, via the constant voltage generating resistor 4b. An output voltage Vpr is output through the source of the first output transistor 23a according to the level of a voltage applied to the gate of the first output transistor 23a. The output voltage Vpr is fed back to the gate of the NMOS transistor 43 (node N21) through the common node N22. On the other hand, an output voltage Vpr is output through the source of the second output transistor 23b according to the level of a voltage applied to the gate of the second output transistor 23b. The output voltage Vpr is fed back to the gate of the NMOS transistor 48 through the common node N22 by way of the constant voltage generating resistor 4b that will be described later.

Furthermore, referring to FIG. 10, and assuming that the voltage at the node N21 becomes lower than the first reference voltage Vref1, the voltage between the gate and source of the other NMOS transistor 43 in the operational amplifier with the first current mirror circuit 40a is lowered, and a current which is to be supplied from the PMOS transistor 41 to the NMOS transistor 43 decreases. A current flowing throughout the operational amplifier with the first current mirror circuit 40a is dominated by the NMOS transistor 44 functioning as a current source. When a current which is to be supplied from the PMOS transistor 41 to the NMOS transistor 43 decreases, a current which is to be supplied from the PMOS transistor 40 to the NMOS transistor 42 increases. This causes the potential at the NMOS transistor 42, that is, the potential at the gate of the first output transistor 23a that is a PMOS transistor, to be lowered. As a result, the voltage between the gate and source of the first output transistor 23a exceeds the threshold voltage. Consequently, the first output transistor 23a enters an operating state, and operates to raise the voltage developed at the node N22 until this voltage becomes equal to the level of the first reference voltage Vref1.

Furthermore, in this case, the voltage between the gate and source of the NMOS transistor 48 in the operational amplifier with the second current mirror 40b falls, and a current which is to be supplied from the PMOS transistor 46 to the NMOS transistor 48 decreases. A current flowing throughout the operational amplifier with the second current mirror circuit 40b is determined by the NMOS transistor 49 functioning as a current source. When a current which is to be supplied from the PMOS transistor 46 to the NMOS transistor 48 decreases, a current which is to be supplied from the PMOS transistor 45 to the NMOS transistor 47 increases. This causes the potential at the drain of the NMOS transistor, that is, the potential at the gate of the second output transistor 23b that is an NMOS transistor, to be lowered. As a result, the voltage between the gate and source of the second output transistor 23b becomes lower than the threshold voltage. Consequently, the second output transistor 23b enters a non-operating state.

In contrast, assuming that the voltage at the node N21 becomes higher than the second reference voltage Vref2, the voltage between the gate and source of the other NMOS transistor 48 in the operational amplifier with the second current mirror circuit 40b rises, and a current which is to be supplied from the PMOS transistor 46 to the NMOS transistor 48 increases. A current which is to be supplied from the PMOS transistor 45 to the NMOS transistor 47 decreases accordingly. This causes the potential at the drain of the NMOS transistor 47, that is, the potential at the gate of the second output transistor 23b that is an NMOS transistor, to rise. As a result, the voltage between the gate and source of the second output transistor 23b exceeds the threshold voltage. The second output transistor 23b enters an operating state, and operates to lower an output voltage at the node N22 until the output voltage becomes equal to the level of the second reference voltage Vref2.

Furthermore, in this case, the voltage between the gate and source of the NMOS transistor 43 in the operational amplifier with the first current mirror circuit 40a rises, and a current which is to be supplied from the PMOS transistor 41 to the NMOS transistor 43 increases. A current which is to be supplied from the PMOS transistor 40 to the NMOS transistor 42 decreases accordingly. This causes the potential at the drain of the NMOS transistor 42, that is, the potential at the gate of the first output transistor 23a that is a PMOS transistor, to rise. As a result, the voltage between the gate and source of the first output transistor 23a becomes lower than the threshold voltage. Consequently, the first output transistor 23a enters a non-operating state.

Figure 3:
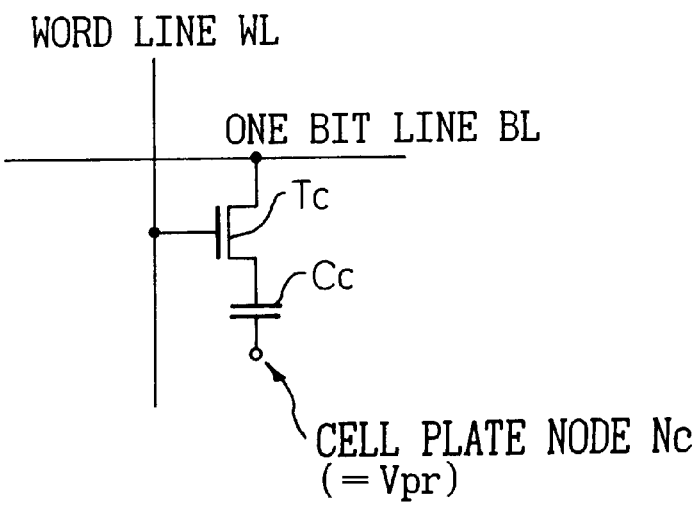
FIG. 3 is a circuit diagram showing an exemplary configuration of a memory cell in a memory cell array shown in FIG. 1.
Figure 4:
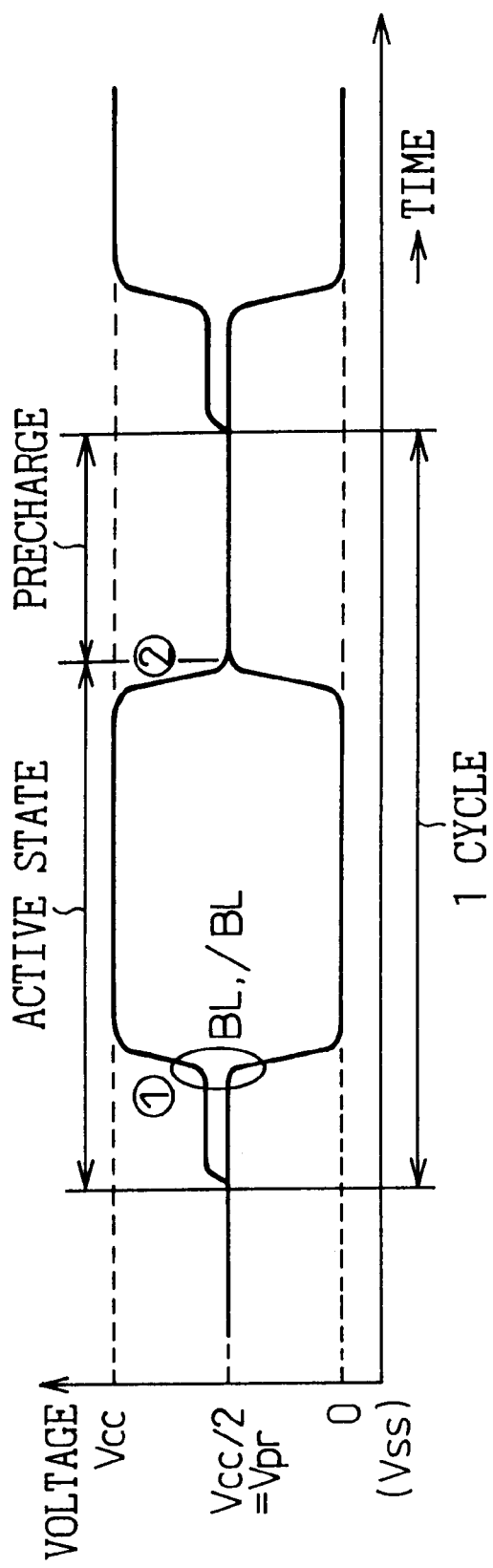
FIG. 4 is a timing chart indicating a variation in the potential at bit lines when the bit lines are precharged with a voltage corresponding to a half of a supply voltage.
Figure 5:
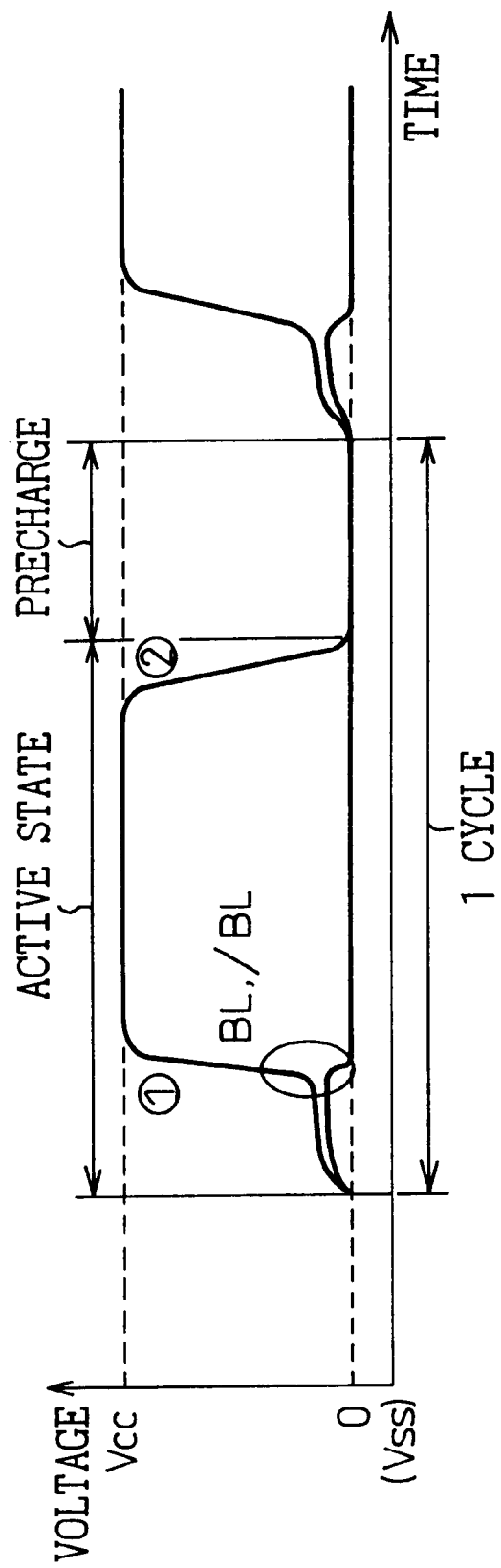
FIG. 5 is a timing chart indicating a variation in the potential at the bit lines when the bit lines are precharged with the supply voltage.
Figure 6:
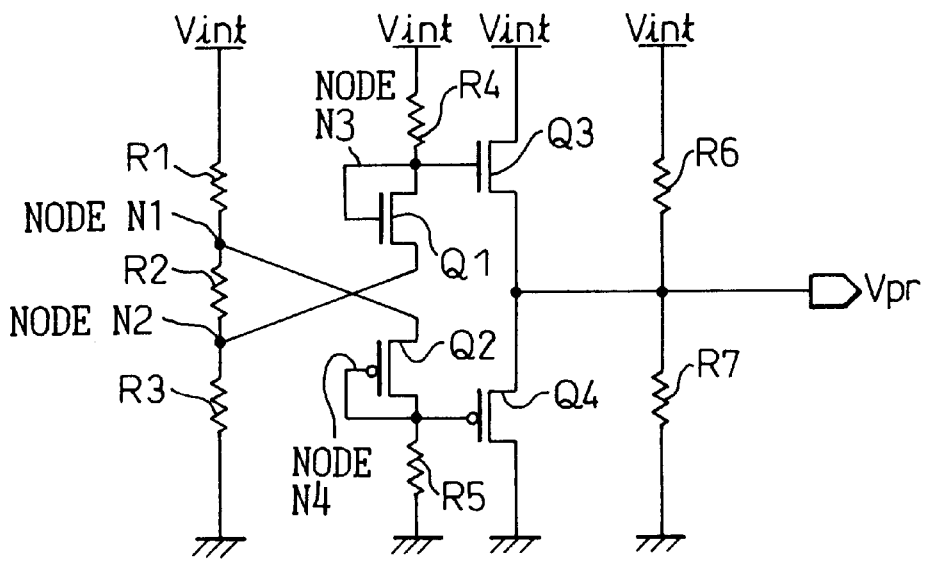
FIG. 6 is a circuit diagram showing an exemplary configuration of a semiconductor integrated circuit including a conventional constant voltage generating circuit.

Furthermore, in the embodiment shown in FIG. 10, three constant voltage generating resistors 3b, 4b, and 5b that are connected in series with each other are used to produce a fraction of an internal supply voltage Vint. Thus, an output voltage Vpr having a lower level than the first reference voltage Vref1 is produced. The constant voltage generating resistors 3b, 4b, and 5b have substantially the same function as the constant voltage generating resistors 3a, 4a, and 5a shown in FIG. 3. Specifically, the voltage at the node N21 coincident with the junction between the constant voltage generating resistors 3b and 4b has the same level as an intermediate level between the level of the first reference voltage Vref1 and the level of second reference voltage Vref2. On the other hand, an output voltage Vpr whose level is lower than the intermediate level is developed at the common node N22 coincident with the junction between the constant voltage generating resistors 4b and 5b.

In summary, assuming that the voltage at the node N21 is lower than the first reference voltage Vref1, the first output transistor 23a operates to lower the potential at the drain of the NMOS transistor 42 in the operational amplifier with the first current mirror circuit 40a so as to raise the output voltage at the node N22.

In contrast, assuming that the voltage at the node N21 is higher than the second reference voltage Vref2, the second output transistor 23b operates to raise the potential at the drain of the NMOS transistor 47 in the operational amplifier with the second current mirror circuit 40b so as to lower the output voltage at the node N22.

As mentioned previously, a voltage level detected by the operational amplifier with the first current mirror circuit 40a and the operational amplifier with the second current mirror circuit 40b may be an intermediate level between the level of the first reference voltage Vref1 and the level of second reference voltage Vref2. In this case, the voltage level is regarded as falling within a dead band. The two output transistors therefore enter non-operating states.

Figure 11:
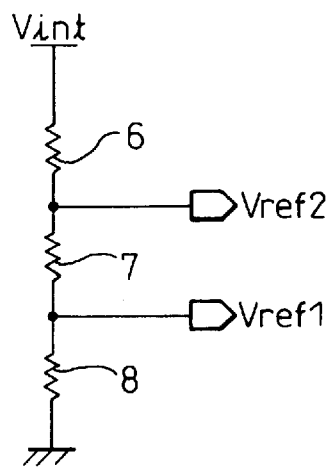
FIG. 11 is a circuit diagram showing an example of a reference voltage generating circuit employed in the embodiment shown in FIG. 10.

FIG. 11 is a circuit diagram showing an example of a reference voltage generating circuit employed in the configuration of the embodiment shown in FIG. 10.

In the reference voltage generating circuit shown in FIG. 11, three reference voltage generating resistors (divider resistors) 6, 7, and 8 that are connected in series with each other are used to produce fractions of an internal supply voltage Vint. Thus, the first reference voltage Vref1 and second reference voltage Vref2, that always have the relationship of Vref1<Vref2, can be produced. Specifically, the second reference voltage Vref2 can be reliably developed at the junction between the reference voltage generating resistor 6 and reference voltage generating resistor 7. Herein the reference voltage generating resistor 6 is located at a position in which the highest voltage level is detected. Moreover, the first reference voltage Vref1 lower than the second reference voltage Vref2 is reliably developed at the junction between the reference voltage generating resistor 8 and reference voltage generating resistor 7. Herein, the reference voltage generating resistor 8 is located at a position in which the lowest voltage level is detected. Furthermore, the reference voltage generating resistors 6 to 8 may be made of the same material (for example, they may be made of polysilicon, or may be made by using resistors fabricated by a diffusion technique). In this case, the first reference voltage Vref1 and second reference voltage Vref2 can be produced at a certain ratio to the internal supply voltage Vint irrespective of a difference in temperature or a difference deriving from a manufacturing process.

Figure 12:
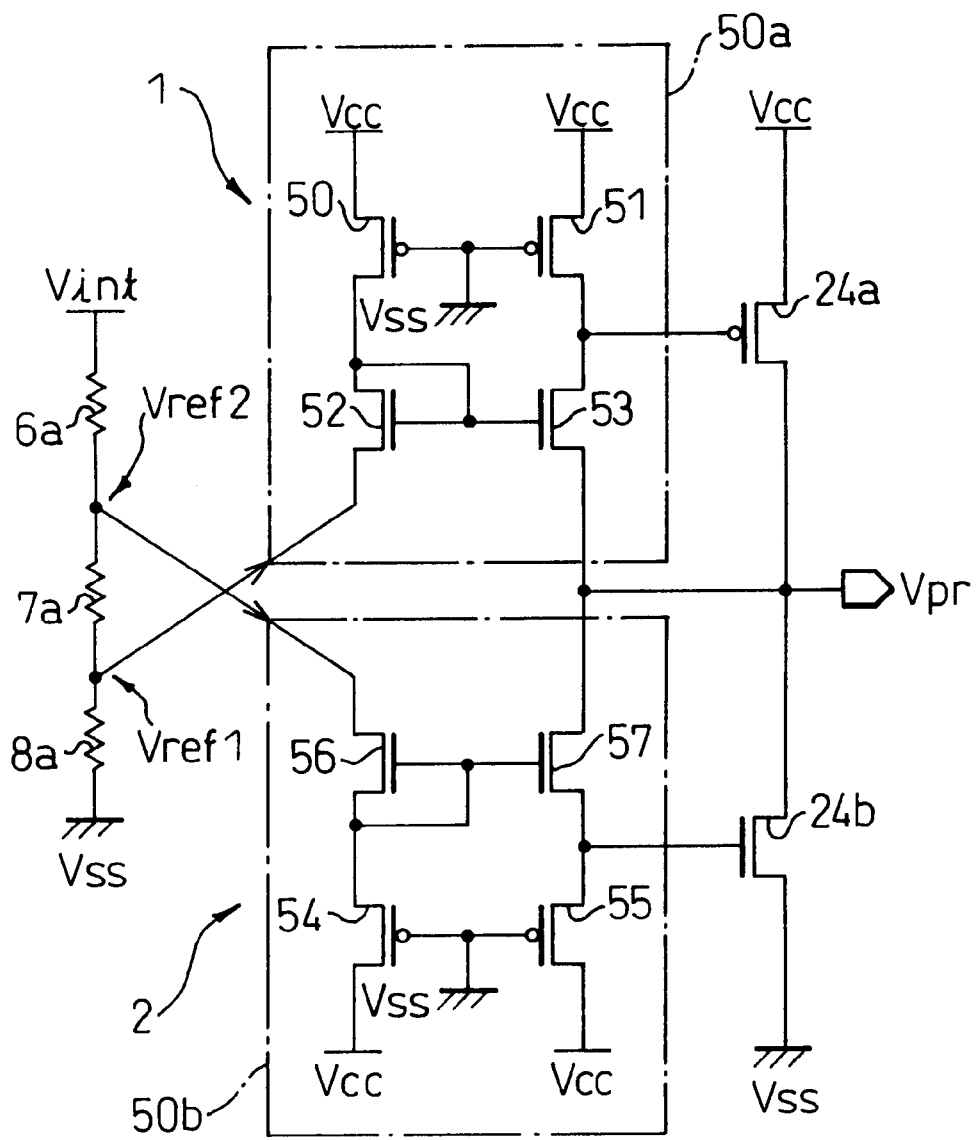
FIG. 12 is a circuit diagram showing a configuration of the fourth preferred embodiment of the present invention.

FIG. 12 is a circuit diagram showing a configuration of the fourth preferred embodiment of the present invention. In the fourth embodiment, operational amplifiers in accordance with the present invention are realized by any operational amplifiers of different type from the operational amplifiers with the current mirror circuits shown in FIGS. 8 to 10.

In the fourth preferred embodiment shown in FIG. 12, three reference voltage generating resistors 6a, 7a, and 8a are, like those in the reference voltage generating circuit shown in FIG. 11, connected in series with each other. The reference voltage generating resistors 6a, 7a, and 8a are used to produce fractions of an internal supply voltage Vint. A first reference voltage Vref1 and second reference voltage Vref2 that always have the relationship of Vref1<Vref2 are thus produced. The reference voltage generating resistors 6a, 7a, and 8a have substantially the same function as the reference voltage generating resistors 6, 7, and 8 shown in FIG. 11.

In the embodiment shown in FIG. 12, first and second operational amplifiers in accordance with the present invention are realized by an operational amplifier with a first current mirror circuit 50a and an operational amplifier with a second current mirror circuit 50b, respectively. The operational amplifier with the first current mirror circuit 50a amplifies a voltage difference between an input voltage and the first reference voltage Vref1. The operational amplifier with the second current mirror circuit 50b amplifiers a voltage difference between the input voltage and second reference voltage Vref2. However, the circuit configuration of each of the operational amplifier with the first current mirror circuit 50a and the operational amplifier with the second current mirror circuit 50b is different from that of each of the operational amplifiers with the current mirrors circuits shown in FIGS. 8 to 10.

Furthermore, in FIG. 12, the operational amplifier with the first current mirror circuit 50a includes a pair of NMOS transistors 52 and 53. The pair of NMOS transistors 52 and 53 function as a differential amplifier, and have the gates and sources thereof connected together in a current mirror connected form. The NMOS transistors 52 and 53 are connected to a first power supply via PMOS transistors 50 and 51, respectively. The first power supply provides a supply voltage Vcc higher than the second reference voltage Vref2. On the other hand, the operational amplifier with the second current mirror circuit 50b includes a pair of NMOS transistors 56 and 57. The pair of NMOS transistors 56 and 57 function as a differential amplifier, and have the gates and sources thereof connected together in a current mirror connected form. The NMOS transistors 56 and 57 are connected to the first power supply for providing the supply voltage Vcc, via PMOS transistors 54 and 55, respectively.

Furthermore, in FIG. 12, the first reference voltage Vref1 is applied to the source of one of the pair of NMOS transistors 52 and 53 in the operational amplifier with first current mirror circuit 50a, that is, the source of the NMOS transistor 52. A voltage difference between an output voltage Vpr (for example, a voltage corresponding to a half of the supply voltage Vcc) and the first reference voltage Vref1 is amplified. The thus amplified voltage is output through the drain of the NMOS transistor 52. The drain of one of the pair of NMOS transistors 52 and 53, that is, the drain of the NMOS transistor 52 is connected to the gate of a first output transistor 24a that is a PMOS transistor. The first output transistor 24a has substantially the same function as the first output transistor 21a shown in FIG. 8.

On the other hand, the first reference voltage Vref2 is applied to the gate of one of the pair of NMOS transistors 56 and 57 in the operational amplifier with the second current mirror circuit 50b, that is, the gate of the NMOS transistor 56. A voltage difference between an output voltage Vpr and the second reference voltage Vref2 is amplified. The thus amplified voltage is output through the drain of the NMOS transistor 57. The drain of the NMOS transistor 57 is connected to the gate of a second output transistor 24b that is an NMOS transistor. The second output transistor 24b has substantially the same function as the second output transistor 21b shown in FIG. 8.

Furthermore, in FIG. 12, the source of the first output transistor 24a is connected to a first power supply for providing the supply voltage Vcc, and the drain thereof is connected to a common node. On the other hand, the source of the second output transistor 24b is connected to a second power supply for providing a supply voltage Vss, and the drain thereof is connected to the common node. The common node is connected to the source of the other NMOS transistor 53 in the first current mirror circuit and to the source of the other NMOS transistor 57 in the operational amplifier with second current mirror circuit. An output voltage Vpr is output through the drain of the first output transistor 24a according to the level of a voltage applied to the gate of the first output transistor 24a. The output voltage Vpr is fed back to the source of the NMOS transistor 53. On the other hand, an output voltage Vpr is output through the drain of the second output transistor 24b according to the level of a voltage applied to the gate of the second output transistor 24b. The output voltage Vpr is fed back to the NMOS transistor 57.

Furthermore, referring to FIG. 12, assuming that the output voltage Vpr becomes lower than the first reference voltage Vref1, the potential at the source of the other NMOS transistor 53 in the operational amplifier with the first current mirror circuit 50a falls, and the voltage between the gate and source thereof rises. This causes the potential at the drain of the NMOS transistor 53, that is, the potential at the gate of the first output transistor 24a that is a PMOS transistor, to be lowered. As a result, the voltage between the gate and source of the first output transistor 24a exceeds the threshold voltage. Consequently, the first output transistor 24a enters an operating state, and operates to raise the output voltage.

Furthermore, in this case, the voltage between the gate and source of the other NMOS transistor 57 in the operational amplifier with the second current mirror circuit 50 rises, and a current which is to be supplied from the PMOS transistor to the NMOS transistor 57 increases. This causes the potential at the drain of the NMOS transistor 57, that is, the potential at the gate of the second output transistor 24b that is an NMOS transistor, to be lowered. As a result, the voltage between the gate and source of the second output transistor 23b becomes lower than the threshold voltage. Consequently, the second output transistor 24b enters a non-operating state.

In contrast, assuming that the output voltage Vpr becomes higher than the second reference voltage Vref2, the potential at the source of the other NMOS transistor 57 in the operational amplifier with the second current mirror circuit 50b rises, and the voltage between the gate and source thereof is lowered. A current which is to be supplied from the PMOS transistor 55 to the NMOS transistor 57 decreases accordingly. This causes the potential at the drain of the NMOS transistor 57, that is, the potential at the gate of the second output transistor 24b that is an NMOS transistor, to rise. As a result, the voltage between the gate and source of the second output transistor 24b exceeds the threshold voltage. Consequently, the second output transistor 24b enters an operating state, and operates to lower the output voltage.

Furthermore, in this case, the voltage between the gate and source of the other NMOS transistor 53 in the operational amplifier with the first current mirror circuit 50a falls, and a current which is to be supplied from the PMOS transistor 51 to the NMOS transistor 53 decreases. This causes the potential at the drain of the NMOS transistor 53, that is, the potential at the gate of the first output transistor 24a that is a PMOS transistor, to rise. As a result, the voltage between the gate and source of the first output transistor 24a exceeds the threshold voltage. Consequently, the first output transistor 24a enters a non-operating state.

In summary, a voltage level detected by the operational amplifier with the first current mirror circuit 50a and the operational amplifier with the second current mirror circuit 50b may be lower than the first reference voltage Vref1. In this case, the first output transistor 24a operates to lower the potential at the drain of the NMOS transistor 53 in the operational amplifier with the first current mirror circuit 50a so as to raise the output voltage.

In contrast, a voltage level detected by the operational amplifier with the first current mirror circuit 50a and the operational amplifier with the second current mirror circuit 50b may be higher than the second reference voltage Vref2. In this case, the second output transistor 24b operates to raise the potential at the drain of the NMOS transistor 57 in the operational amplifier with the second current mirror circuit 50b so as to lower the output voltage.

The fourth preferred embodiment resembles the third preferred embodiment. Namely, when a voltage level detected by the operational amplifier with the first current mirror circuit 50a and the operational amplifier with the second current mirror circuit 50b is an intermediate level between the level of the first reference voltage Vref1 and the level of second reference voltage Vref2, the voltage level is regarded as falling within a dead zone. Both the two output transistors then enters non-operating states.

Figure 13:
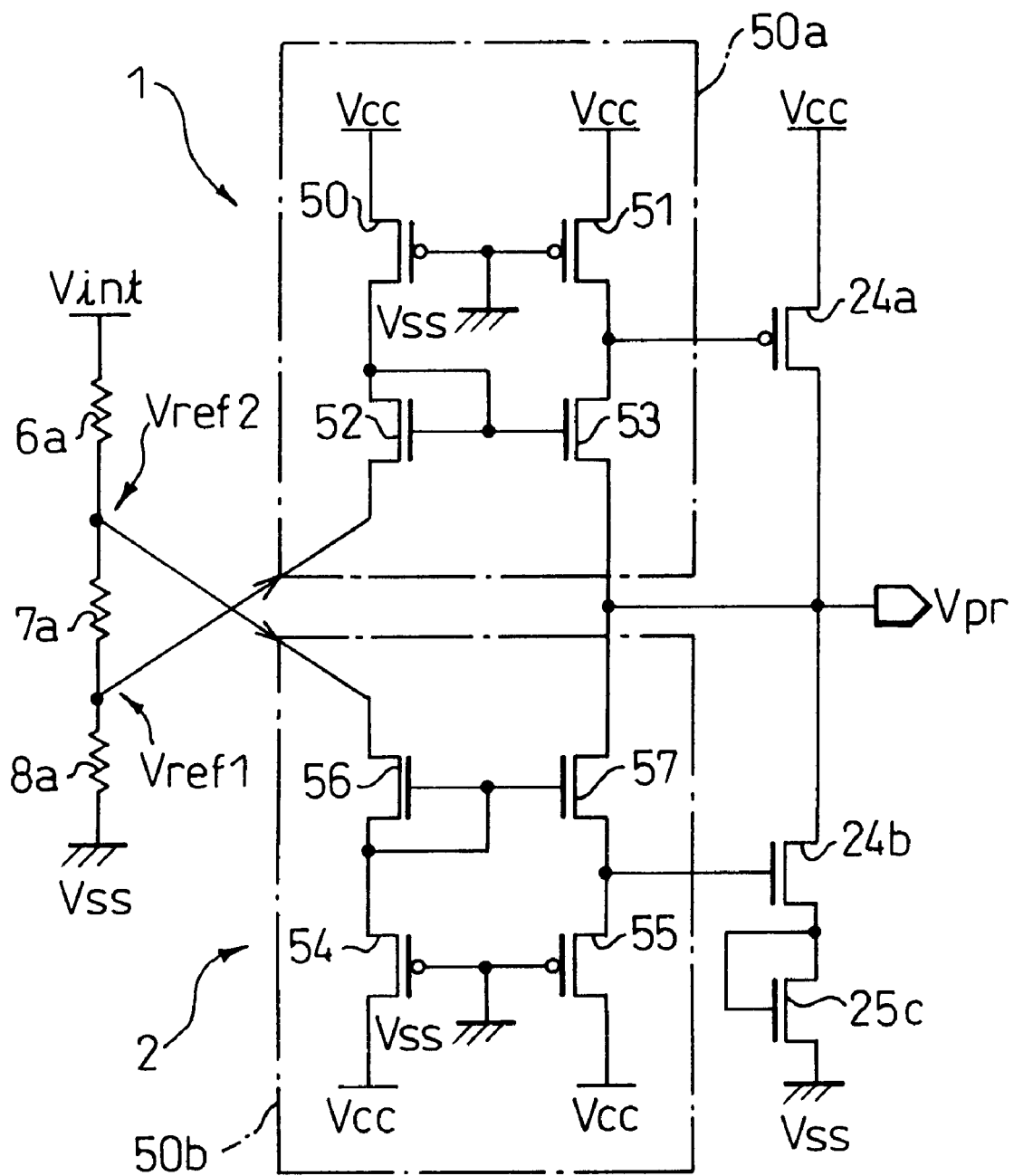
FIG. 13 is a circuit diagram showing a configuration of the fifth preferred embodiment of the present invention.

FIG. 13 is a circuit diagram showing a configuration of a fifth preferred embodiment of the present invention. A semiconductor integrated circuit in accordance with the fifth preferred embodiment is provided with a penetrating current suppressing diode 25c in addition to the same circuit configuration as the fourth preferred embodiment shown in FIG. 12. The circuit elements other than the penetrating current suppressing diode 25c are identical to those in the fourth preferred embodiment shown in FIG. 12. An explanation about the details of the operational amplifier with the current mirror circuits and output transistors other than the penetrating current suppressing diode 25c will be omitted.

In general, when the potential at the drain of an NMOS transistor is high, it is nearly equal to the level of a supply voltage Vcc. In contrast, when the potential at the drain of the NMOS transistor is low, it is a little higher than an output voltage Vpr.

On the other hand, when the potential at the drain of a PMOS transistor is high, it is a little lower than the level of the supply voltage Vcc. In contrast, when the potential at the drain of the PMOS transistor is low, the low level at the output terminal is nearly equal to the ground level (0 V).

More particularly, in FIG. 13, even when the NMOS transistor 57 in the operational amplifier with the second current mirror circuit 50b enters a non-operating state, the potential at the drain of the NMOS transistor 57 is a little higher than the output voltage Vpr. The potential at the gate or input terminal of the second output transistor 24b connected to the drain of the NMOS transistor 57 serving as the output terminal of the operational amplifier with the second current mirror 50b is not lowered sufficiently. As a result, the voltage between the gate and source of the first output transistor 24b may not become lower than the threshold voltage. The second output transistor 24b may not change from an operating state to a non-operating state. This leads to a drawback that when the first output transistor 24a is operating, a penetrating current flows from the first power supply to the second power supply, via the first output transistor 24a and second output transistor 24b. Herein, the first power supply provides the supply voltage Vcc, and the second power supply provides the supply voltage Vss.

The fifth preferred embodiment shown in FIG. 13 has been devised to cope with the above drawback. A penetrating current suppressing diode 25c is interposed between the second output transistor 24b and second power supply. Owing to the penetrating current suppressing diode 25c, the potential at the source of the first output transistor 24b can be raised to the potential a little higher than the ground level. Even when the potential at the gate of the first output transistor 24b is a little higher than the ground level, the voltage between the gate and source of the first output transistor 24b substantially becomes lower than the threshold voltage. Consequently, the second output transistor 24b can be reliably driven to a non-operating state.

Consequently, when the first output transistor 24a, that is a PMOS transistor, is operating, the second output transistor 24b, that is an NMOS transistor, enters an operating state. A penetrating current can be prevented from flowing from the first power supply to the second power supply, via the first output transistor 24a and second output transistor 24b.

Figure 14:
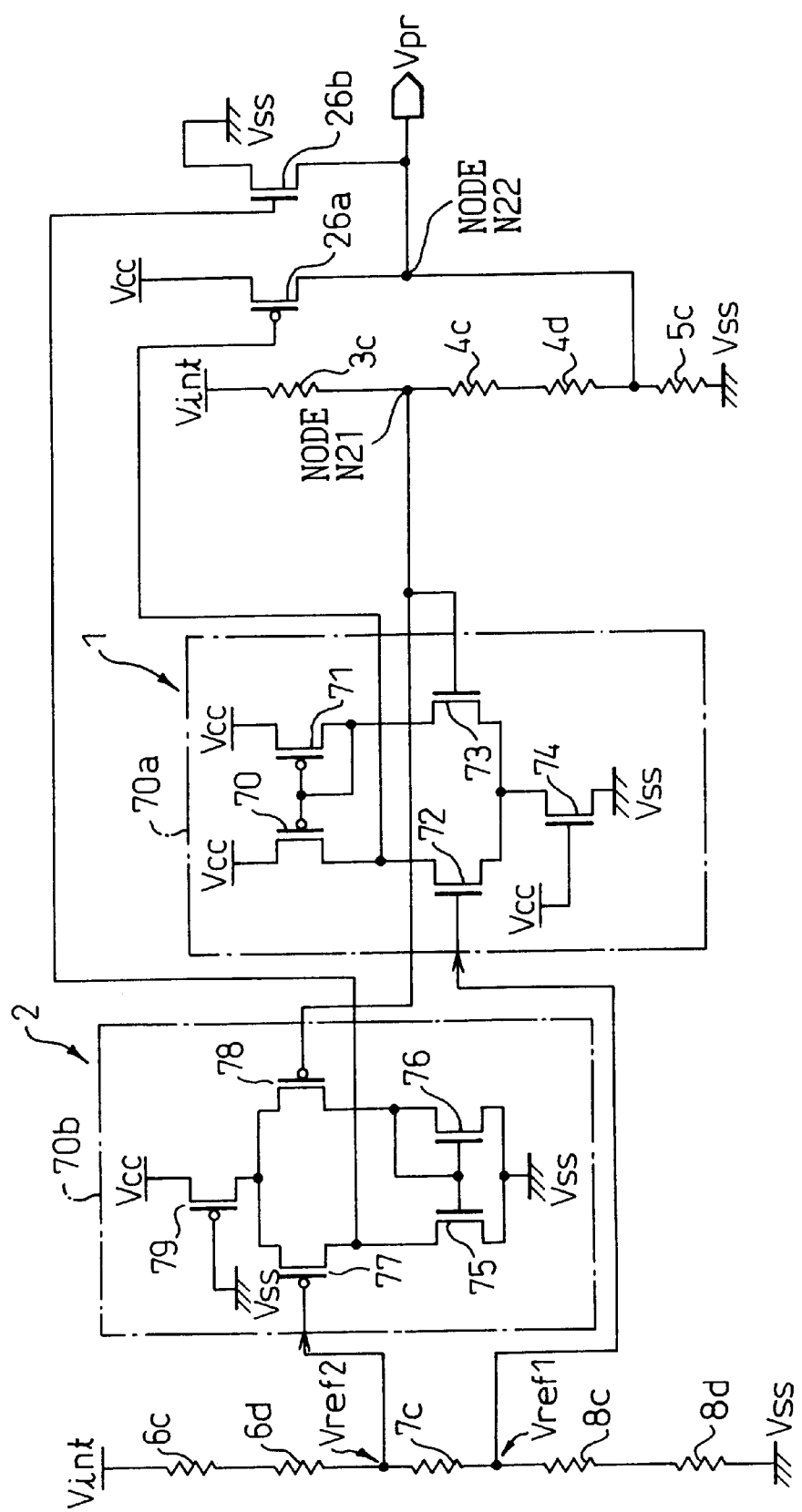
FIG. 14 is a circuit diagram showing a configuration of the sixth preferred embodiment of the present invention.

FIG. 14 is a circuit diagram showing a configuration of the sixth preferred embodiment of the present invention. In the sixth preferred embodiment, the drain of a PMOS transistor 77 in an operational amplifier with a second current mirror circuit 70b is connected to the gate of a second output transistor 26b that is an NMOS transistor. As mentioned previously, when a PMOS transistor enters a non-operating state and the potential at the drain thereof is low, the low level is nearly equal to the ground level. Owing to the above circuit configuration, when the second output transistor 26b that is an NMOS transistor enters a non-operating state, the potential at the gate of the second output transistor 26b becomes nearly equal to the ground level. The voltage between the gate and source of the first output transistor 24b becomes lower than the threshold voltage. Consequently, the second output transistor 26b enters a non-operating state reliably.

Consequently, when the first output transistor 26a that is a PMOS transistor is operating, the second output transistor 26b that is an NMOS transistor enters a non-operating state. A penetrating current can be reliably prevented from flowing from the first power supply to the second power supply, through the first output transistor 26a and second output transistor 26b.

Next, the operational amplifier with the first current mirror circuit 70a and the operational amplifier with the second current mirror circuit 70b in the preferred embodiment shown in FIG. 14, and other relevant circuit elements will be described.

In the embodiment shown in FIG. 14, the configuration of the operational amplifier with first current mirror circuit 70a is identical to that of the operational amplifier with the current mirror circuit in the third preferred embodiment. However, the operational amplifier with the second current mirror circuit 70b employs, unlike the counterpart in the third preferred embodiment, PMOS transistors as a pair of transistors functioning as a differential amplifier, in place of NMOS transistors.

Furthermore, in FIG. 14, the operational amplifier with the first current mirror circuit 70a consists of a pair of PMOS transistors 72 and 73, an NMOS transistor 74, and two PMOS transistors 70 and 71. The paired PMOS transistors 72 and 73 function as a differential amplifier. The NMOS transistor 74 functions as a current source for the whole operational amplifier with the current mirror circuit. The PMOS transistors 70 and 71 having the gates and sources thereof connected together in a current mirror connected form are used to adjust a current flowing into one of the paired NMOS transistors 72 and 73, that is, the NMOS transistor 72. On the other hand, the operational amplifier with the second current mirror circuit 70b consists of a pair of PMOS transistors 77 and 78, a PMOS transistor 79, and two NMOS transistors 75 and 76. The pair of PMOS transistors 77 and 78 function as a differential amplifier. The PMOS transistor 79 functions as a current source for the whole operational amplifier with the current mirror circuit. The two NMOS transistors 75 and 76 having the gates and sources thereof connected together in a current mirror connected form are used to adjust a current flowing into one of the pair of PMOS transistors 77 and 78, that is, the PMOS transistor 77.

Furthermore, in FIG. 14, the first reference voltage Vref1 is applied to the gate of one of the pair of NMOS transistors 72 and 73 in the operational amplifier with the first current mirror 70a, that is, the gate of the NMOS transistor 72. A voltage difference between a voltage at a node N21 and the first reference voltage Vref1 is amplified. The thus amplified voltage is output through the drain of the NMOS transistor 72. The drain of the NMOS transistor 72 that is one of the pair of NMOS transistors 72 and 73 is connected to the gate of a first output transistor 26a that is a PMOS transistor.

On the other hand, the second reference voltage Vref2 is applied to the gate of one of the pair of PMOS transistors 77 and 78 in the operational amplifier with the second current mirror circuit 70b, that is, the gate of the PMOS transistor 77. A voltage difference between a voltage at the node N21 and the second reference voltage Vref2 is amplified. The thus amplified voltage is output through the drain of the PMOS transistor 77. Furthermore, the drain of the PMOS transistor 77 that is one of the pair of PMOS transistors 77 and 78 is connected to the gate of a second output transistor 26b that is an NMOS transistor.

Furthermore, in FIG. 14, the source of the first output transistor 26a is connected to a first power supply for providing a supply voltage Vcc higher than the second reference voltage Vref2. The drain of the first output transistor 26a is connected to a common node N22. On the other hand, the source of the second output transistor 26b is connected to a second power supply for providing a supply voltage Vss lower than the first reference voltage Vref1. The drain of the second output transistor 26b is connected to the common node N22. Furthermore, the common node N22 is connected to the gate of the other NMOS transistor 73 in the operational amplifier with the first current mirror circuit, and to the gate of the other PMOS transistor 78 in the operational amplifier with the second current mirror circuit, via constant voltage generating resistors 4c and 4d. An output voltage Vpr is output through the drain of the first output transistor 26a according to the level of a voltage applied to the gate of the first output transistor 26a. The output voltage Vpr is fed back to the gate (node N21) of the NMOS transistor 73, via constant the voltage generating resistors 4d and 4c through the common node N22. On the other hand, an output voltage Vpr is output through the drain of the second output transistor 26b according to the level of a voltage applied to the gate of the second output transistor 26b. The output voltage Vpr is fed back to the gate of the PMOS transistor 78, via the constant voltage generating resistors 4d and 4c through the common node N22.

Furthermore, referring to FIG. 14, assume that the voltage at the node N21 becomes lower than the first reference voltage Vref1, the voltage between the gate and source of the other NMOS transistor 73 in the operational amplifier with the first current mirror circuit 70a falls, and a current which is to be supplied from the PMOS transistor 71 to the NMOS transistor 73 decreases. A current flowing throughout the operational amplifier with the first current mirror circuit 70a is dominated by the NMOS transistor 74 functioning as a current source. When a current which is to be supplied from the PMOS transistor 71 to the NMOS transistor 73 decreases, a current which is to be supplied from the PMOS transistor 70 to the NMOS transistor 72 increases. This causes the potential at the drain of the NMOS transistor 72, that is, the potential at the gate of the first output transistor 26a that is a PMOS transistor, to be lowered. As a result, the voltage between the gate and source of the first output transistor 26a exceeds the threshold voltage. Consequently, the first output transistor 26a enters an operating state, and operates to raise the output voltage Vpr.

Furthermore, in this case, the voltage between the gate and source of the other PMOS transistor 78 in the operational amplifier with the second current mirror circuit 70b rises, and a current which is to be supplied from the NMOS transistor 76 to the PMOS transistor 78 increases. A current which is to be supplied from the NMOS transistor 75 to the PMOS transistor 77 decreases accordingly. This causes the potential at the drain of the PMOS transistor 77, that is, the potential at the gate of the second output transistor 26b that is an NMOS transistor, to be lowered. As a result, the voltage between the gate and source of the second output transistor 26b becomes lower than the threshold voltage. Consequently, the second output transistor 26b enters a non-operating state. As mentioned previously, the drain of the PMOS transistor 77 is connected to the gate of the second output transistor 26b that is an NMOS transistor. The second output transistor 26b can be reliably driven to a non-operating state.

In contrast, assume that the voltage at the node N21 becomes higher than the second reference voltage Vref2. In this case, the voltage between the gate and source of the other PMOS transistor 78 in the operational amplifier with the second current mirror circuit 70b falls, and a current which is to be supplied from the NMOS transistor 76 to the PMOS transistor 78 decreases. A current which is to be supplied from the NMOS transistor 75 to the PMOS transistor 77 increases accordingly. This causes the potential at the drain of the PMOS transistor 77, that is, the potential at the gate of the second output transistor 26b that is an NMOS transistor, to rise. As a result, the voltage between the gate and source of the second output transistor 26 exceeds the threshold voltage. Consequently, the second output transistor 26b enters an operating state, and operates to lower the output voltage Vpr.

Furthermore, in this case, the voltage between the gate and source of the other NMOS transistor 73 in the operational amplifier with the first current mirror circuit 70a rises, and a current which is to be supplied from the PMOS transistor 71 to the NMOS transistor 73 increases. A current which is to be supplied from the PMOS transistor 70 to the NMOS transistor 72 decreases accordingly. This causes the potential at the drain of the NMOS transistor 72, that is, the potential at the gate of the first output transistor 23a that is a PMOS transistor, to rise. As a result, the voltage between the gate and source of the first output transistor 26a exceeds the threshold voltage. Consequently, the first output transistor 26a enters a non-operating state.

Furthermore, in FIG. 14, five reference voltage generating resistors 6c, 6d, 7c, 8c, and 8d that are connected in series with each other are used to produce a fraction of an internal supply voltage Vint. Thus, the first reference voltage Vref1 and second reference voltage Vref2 having the relationship of Vref1<Vref2 all the time are produced. More particularly, the second reference voltage Vref2 is reliably developed at the junction between the reference voltage producing resistor 6d and reference voltage generating resistor 7c. On the other hand, the first reference voltage Vref1, lower than the second reference voltage Vref2, is reliably developed at the junction between the reference voltage generating resistor 7c and reference voltage producing resistor 8c. Herein, the reference voltage generating resistor 7c is located at a position in which a lower voltage level is detected.

Furthermore, in FIG. 14, four constant voltage generating resistors 3c, 4c, 4d, and 5c that are connected in series with one another are used to produce fractions of the internal supply voltage Vint. Thus, an output voltage Vpr lower than the first reference voltage Vref1 is produced. The constant voltage generating resistors 3c to 5c have substantially the same function as the constant voltage generating resistors 3b, 4b, and 5b shown in FIG. 10. Herein, the output voltage Vpr lower than the first reference voltage Vref1 is developed at the common node N22 coincident with the junction between the constant voltage generating resistor 4d and constant voltage generating resistor 5c.

In summary, the voltage level detected by the operational amplifier with the first current mirror circuit 70a and the operational amplifier with the second current mirror circuit 70b may be lower than the first reference voltage Vref1. In this case, the first output transistor 26a operates to lower the potential at the drain of the NMOS transistor 72 in the operational amplifier with the first current mirror circuit 70a so as to raise the output voltage at the node N22.

In contrast, the voltage level detected by the operational amplifier with the first current mirror circuit 70a and the operational amplifier with the second current mirror circuit 70b may be higher than the second reference voltage Vref2. In this case, the second output transistor 26b operates to raise the potential at the drain of the PMOS transistor 77 in the operational amplifier with the second current mirror circuit so as to lower the output voltage at the node N22.

In the sixth preferred embodiment, as in the third and fourth preferred embodiments, the voltage level detected by the first output transistor 26a and second output transistor 26b may be an intermediate level between the level of the first reference voltage Vref1 and the level of the second reference voltage Vref2. In this case, the voltage level is regarded as falling within a dead zone. Both the two output transistors then enter non-operating states.

As described above, according to several typical embodiments of a semiconductor integrated circuit of the present invention, first, a voltage difference between a voltage applied to an input terminal and a reference voltage is amplified by a pair of operational amplifiers. Output transistors are turned ON or turned OFF according to the level of an amplified voltage. Output voltages of the output transistors are fed back to the input terminals of the operational amplifiers. Thus, an intended voltage is produced accurately. Dependency on the threshold voltage between the gate and source of a transistor is relatively small compared with conventional case. Even when a supply voltage is lowered, a constant voltage corresponding to a half of a supply voltage can be produced stably.

Furthermore, according to several typical embodiments of a semiconductor integrated circuit of the present invention, second, a pair of operational amplifiers are realized by the operational amplifiers with the current mirror circuits. The operational amplifiers with the current mirror circuits drive output transistors. Despite the simple circuit configuration, an ability to drive the output transistors can be exerted fully under a low voltage operating environment. A constant voltage corresponding to a half of a supply voltage can be produced stably.

Furthermore, according to several typical embodiments of a semiconductor integrated circuit of the present invention, third, the operational amplifiers with the current mirror circuits are allowed to operate by using a reference voltage that permits the operational amplifier with the current mirror circuits to operate readily. A desired output voltage lower than the reference voltage is thus produced. Even when a supply voltage is very low, the operational amplifiers with the current mirror circuits can be allowed to operate stably. A relatively low constant voltage can be produce accurately.

Furthermore, according to several typical embodiments of a semiconductor integrated circuit of the present invention, fourth, reference voltages of different levels are input to a pair of operational amplifiers. A dead zone is specified to detect an output voltage. A penetrating current can therefore be prevented from flowing into output transistors. Stable operation is guaranteed for a circuit for producing a constant voltage that is a voltage corresponding to a half of a supply voltage.

Furthermore, according to several typical embodiments of a semiconductor integrated circuit of the present invention, fifth, divider resistors are used to produce two reference voltages as fractions of a supply voltage. One of the reference voltages is set to be always lower than the other reference voltage. A dead zone can be specified to detect an output voltage irrespective of a difference in temperature or a difference deriving from manufacturing process. Stable operation is guaranteed for a circuit for producing a constant voltage that is a voltage corresponding to a half of a supply voltage.

Furthermore, according to several typical embodiments of a semiconductor integrated circuit of the present invention, sixth, a diode is interposed between one output transistor that is an NMOS transistor and a power supply. The output transistor can be reliably driven to a non-operating state. A penetrating current can reliably be prevented from flowing between the two output transistors. A circuit for producing a voltage corresponding to a half of a supply voltage can be allowed to operate stably.

Furthermore, according to several typical embodiments of a semiconductor integrated circuit of the present invention, seventh, an output terminal of a PMOS transistor in the operational amplifier with the current mirror circuit is connected to an input terminal of one output transistor that is an NMOS transistor. The output transistor can therefore be reliably driven to an non-operating state. A penetrating current can be reliably prevented from flowing between two output transistors. Consequently, a circuit for producing a constant voltage that is a voltage corresponding to a half of a supply voltage can operate stably.

What is claimed is:

1. A semiconductor integrated circuit producing a given output voltage, comprising:

a first operational amplifier and a second operational amplifier for detecting a voltage difference between a voltage applied to an input terminal and at least one reference voltage; and a first transistor and a second transistor which are turned ON and turned OFF according to the levels of voltages output from said first and second operational amplifiers;

wherein said first operational amplifier receives said output voltage at the input terminal, when the level of the output voltage becomes less than said at least one reference voltage, said first operational amplifier allows said first transistor to operate so as to raise said output voltage; and said second operational amplifier receives said output voltage at the input terminal, when the level of said output voltage exceeds said at least one reference voltage, said second operational amplifier allows said second transistor to operate so as to lower said output voltage, wherein said first and second operational amplifiers include a first current mirror circuit and a second current mirror circuit, respectively, and each of said first and second operational amplifiers are connected to a pair of transistors functioning as a differential amplifier, respectively;

the reference voltage is applied to a gate of one of said pair of transistors in each of said first and second operational amplifiers, and said output voltage is applied to a gate of the other transistor of said pair of transistors, and the voltage of an output terminal of each of said first and second operational amplifiers is output from a drain of one of said pair of transistors;

a gate of said first transistor is connected to said output terminal of said first operational amplifier, and a source and a drain thereof are connected to a first power supply for providing a voltage higher than the reference voltage, and to a common node, respectively;

a gate of said second transistor is connected to said output terminal of said second operational amplifier, and a drain of and a source thereof are connected to said common node, and to a second power supply for providing a voltage lower than the reference voltage, respectively; and said common node outputs said output voltage, and is connected to a gate of the other transistor of said pair of transistors in each of said first and second operational amplifiers.

2. A semiconductor integrated circuit according to claim 1, wherein said semiconductor integrated circuit further comprises adjusting resistors for shifting the level of said output voltage; and wherein said common node is connected to a gate of the other transistor of said pair of transistors in each of said first and second operational amplifiers, via said adjusting resistors.

3. A semiconductor integrated circuit according to claim 1, wherein:

the reference voltages include a first reference voltage and second reference voltage having mutually different levels, and said first reference voltage is applied to one of said pair of transistor in said first operational amplifier, and said second reference voltage is applied to one of said pair of transistor in said second operational amplifier.

4. A semiconductor integrated circuit according to claim 3, wherein said semiconductor integrated circuit further comprises adjusting resistors for shifting the level of said output voltage; and wherein said common node is connected to a gate of the other transistor of said pair of transistors in each of said first and second operational amplifiers, via said adjusting transistors; and the level of the first reference voltage is always set to a smaller value than that of the second reference voltage.

5. A semiconductor integrated circuit according to claim 1, wherein said pair of transistors in each of said first and second operational amplifiers are a first conductivity type of transistor; and said first transistor is a second conductivity type of transistor, and said second transistor is the first conductivity type of transistor.

6. A semiconductor integrated circuit according to claim 2, wherein said pair of transistors in each of said first and second operational amplifiers are a first conductivity type of transistor; and said first transistor is a second conductivity type of transistor, and said second transistor is the first conductivity type of transistor.

7. A semiconductor integrated circuit according to claim 3, wherein said pair of transistors in each of said first and second operational amplifiers are a first conductivity type of transistor; and said first transistor is a second conductivity type of transistor, and said second transistor is the first conductivity type of transistor.

8. A semiconductor integrated circuit according to claim 4, wherein said pair of transistors in each of said first and second operational amplifiers are a first conductivity type of transistor; and said first transistor is a second conductivity type of transistor, and said second transistor is the first conductivity type of transistor.

9. A semiconductor integrated circuit according to claim 5, wherein a penetrating current suppressing diode is interposed between said second transistor and second power supply.

10. A semiconductor integrated circuit according to claim 6, wherein a penetrating current suppressing diode is interposed between said second transistor and second power supply.

11. A semiconductor integrated circuit according to claim 6, wherein a penetrating current suppressing diode is interposed between said second transistor and second power supply.

12. A semiconductor integrated circuit according to claim 8, wherein a penetrating current suppressing diode is interposed between said second transistor and second power supply.

13. A semiconductor integrated circuit according to claim 1, wherein said pair of transistors in said first current mirror circuit are a first conductivity of transistor type, and said pair of transistors in said second current mirror circuit are a second conductivity type of transistor;

said first transistor is the second conductivity type of transistor, and said second transistor is the first conductivity type of transistor; and when said first transistor is operating, said second operational amplifier controls said second transistor to a non-operating state, and a penetrating current is thus prevented from flowing from said first power supply to said second power supply, through said first transistor and second transistor.

14. A semiconductor integrated circuit according to claim 2, wherein said pair of transistors in said first current mirror circuit are a first conductivity of transistor type, and said pair of transistors in said second current mirror circuit are a second conductivity type of transistor;

said first transistor is the second conductivity type of transistor, and said second transistor is the first conductivity type of transistor; and when said first transistor is operating, said second operational amplifier controls said second transistor to a non-operating state, and a penetrating current is thus prevented from flowing from said first power supply to said second power supply, through said first transistor and second transistor.

15. A semiconductor integrated circuit according to claim 3, wherein said pair of transistors in said first current mirror circuit are a first conductivity type of transistor, and said pair of transistors in said second current mirror circuit are a second conductivity type of transistor;

said first transistor is the second conductivity type of transistor, and said second transistor is the first conductivity type of transistor; and when said first transistor is operating, said second operational amplifier controls said second transistor to a non-operating state, and a penetrating current is thus prevented from flowing from said first power supply to said second power supply, through said first transistor and second transistor.

16. A semiconductor integrated circuit according to claim 4, wherein said pair of transistors in said first current mirror circuit are a first conductivity of transistor type, and said pair of transistors in said second current mirror circuit are a second conductivity type of transistor;

said first transistor is the second conductivity type of transistor, and said second transistor is the first conductivity type of transistor; and when said first transistor is operating, said second operational amplifier controls said second transistor to a non-operating state, and a penetrating current is thus prevented from flowing from said first power supply to said second power supply, through said first transistor and second transistor.

17. A constant voltage generation circuit, comprising:

a reference voltage generation circuit for providing a reference voltage having a constant voltage;

an output terminal for providing an output signal of the constant voltage generating circuit;

a first detection circuit and a second detection circuit for outputting a first control signal and a second control signal in response to a difference between said reference voltage and a voltage of said output signal;

a single PMOS transistor disposed between a higher voltage supply and said output terminal, a conductance of which is controlled by said first control signal; and a single NMOS transistor disposed between said output terminal and a lower voltage supply source, a conductance of which is controlled by said second control signal.

18. A constant voltage generation circuit comprising:

a reference voltage generation circuit for providing a reference voltage;

an output terminal for providing an output signal:

a first detection circuit and a second detection circuit for outputting a first control signal and a second control signal in response to a difference between said reference voltage and a voltage of said output signal;

a PMOS transistor disposed between a higher voltage supply and said output terminal, a conductance of which is controlled by said first control signal; and an NMOS transistor disposed between said output terminal and a lower voltage supply source a conductance of which is controlled by said second control signal, wherein each of said first and second detection circuits comprises:

a pair of transistors, gates of which receive said input signals, and drains of which are commonly coupled to said second voltage supply source; and a current mirror circuit disposed between said first voltage supply source and said pair of transistors; and wherein said first and second control signals are output respectively from connection nodes between corresponding said current mirror circuit and corresponding said pair of transistors.

19. A constant voltage generation circuit according to claim 17, further including:

a voltage shift circuit disposed between said output terminal and input terminals of said first and second detection circuits.

20. A constant voltage generation circuit according to claim 17, wherein said reference voltage generation circuit provides first and second reference voltages having different voltages, and said first detection circuit is responsive to said first reference voltage, and said second detection circuit is responsive to said second reference voltage.

21. A constant voltage generation circuit according to claim 17, wherein each of said first and second detection circuits comprises:

a current mirror circuit, coupled to said first voltage supply source, for receiving said reference voltage and said output signal, respectively; and wherein said first and second control signals are output respectively from connection nodes between said first voltage supply source and said current mirror circuit.

22. A constant voltage generation circuit according to claim 18, wherein said pair of transistors in said first detection circuit are NMOS transistors, and said pair of transistors in said second detection circuit are PMOS transistors.

23. A constant voltage generation circuit according to claim 17, wherein said output terminal is coupled to at least one of bit lines and cell capacitors in a dynamic random access memory.

24. A constant voltage generation circuit according to claim 19, wherein said output signal has a voltage which is half of a voltage between said first and second voltage supply sources.

* * * * *